United States Patent
Tsutsumi et al.

(10) Patent No.: US 9,754,956 B2
(45) Date of Patent: Sep. 5, 2017

(54) UNIFORM THICKNESS BLOCKING DIELECTRIC PORTIONS IN A THREE-DIMENSIONAL MEMORY STRUCTURE

(71) Applicant: SanDisk Technologies, Inc., Plano, TX (US)

(72) Inventors: Masanori Tsutsumi, Yokkaichi (JP); Shinsuke Yada, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 268 days.

(21) Appl. No.: 14/560,444

(22) Filed: Dec. 4, 2014

(65) Prior Publication Data

US 2016/0163728 A1    Jun. 9, 2016

(51) Int. Cl.
*H01L 27/11582*    (2017.01)
*H01L 27/11519*    (2017.01)
(Continued)

(52) U.S. Cl.
CPC .... *H01L 27/11582* (2013.01); *H01L 27/1157* (2013.01); *H01L 27/11519* (2013.01);
(Continued)

(58) Field of Classification Search
CPC ......... H01L 27/11582; H01L 27/11519; H01L 27/11524
See application file for complete search history.

(56) References Cited

U.S. PATENT DOCUMENTS 5,084,417 A    1/1992 Joshi et al.
5,807,788 A    9/1998 Brodsky et al.
(Continued)

FOREIGN PATENT DOCUMENTS

WO    WO 02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Errol Fernandes
(74) *Attorney, Agent, or Firm* — The Marbury Law Group PLLC

(57) ABSTRACT

A memory opening is formed through a stack of alternating layers comprising first material layers and second material layers. Sidewall surfaces of the second material layers are laterally recessed with respect to sidewall surfaces of the first material layers within the memory opening. Annular semiconductor material portions can be formed by depositing a semiconductor material from the sidewall surfaces of the second material layers while the semiconductor material does not grow from surfaces of the first material layers. Optionally, an inner portion of each annular semiconductor material portion can be converted into an annular dielectric material portion that includes a dielectric material. A memory film is formed in the memory opening. During removal of the second material layers, the annular semiconductor material portions can be employed as an etch stop material, thereby minimizing collateral etching of the memory film or annular dielectric material portions.

13 Claims, 21 Drawing Sheets

(51) Int. Cl.
*H01L 27/11556* (2017.01)
*H01L 27/11524* (2017.01)
*H01L 27/1157* (2017.01)
*H01L 29/66* (2006.01)
*H01L 29/792* (2006.01)

(52) U.S. Cl.
CPC .. *H01L 27/11524* (2013.01); *H01L 27/11556* (2013.01); *H01L 29/66833* (2013.01); *H01L 29/7926* (2013.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,378,353 | B2 | 5/2008 | Lee et al. |
| 7,514,321 | B2 | 4/2009 | Mokhlesi et al. |
| 7,575,973 | B2 | 8/2009 | Mokhlesi et al. |
| 7,608,195 | B2 | 10/2009 | Wilson |
| 7,648,872 | B2 | 1/2010 | Benson |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,093,725 | B2 | 1/2012 | Wilson |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,415,742 | B2 | 4/2013 | Kim et al. |
| 2006/0102586 | A1 | 5/2006 | Lee et al. |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0163968 | A1* | 7/2010 | Kim .................. H01L 27/11582 257/324 |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0233648 | A1* | 9/2011 | Seol .................. H01L 21/32137 257/324 |
| 2011/0266606 | A1 | 11/2011 | Park et al. |
| 2011/0294290 | A1* | 12/2011 | Nakanishi ......... H01L 27/11551 438/666 |
| 2012/0001247 | A1 | 1/2012 | Alsmeier |
| 2012/0001249 | A1 | 1/2012 | Alsmeier |
| 2012/0205722 | A1* | 8/2012 | Lee .................... H01L 27/1157 257/211 |
| 2012/0256247 | A1 | 10/2012 | Alsmeier |
| 2012/0267699 | A1* | 10/2012 | Kiyotoshi ......... H01L 27/11524 257/319 |
| 2013/0056820 | A1* | 3/2013 | Jeong ................ H01L 27/0688 257/324 |
| 2013/0122712 | A1 | 5/2013 | Kim et al. |
| 2013/0224960 | A1 | 8/2013 | Payyapilly et al. |
| 2013/0248974 | A1 | 9/2013 | Alsmeier et al. |
| 2013/0264631 | A1 | 10/2013 | Alsmeier et al. |
| 2013/0270625 | A1* | 10/2013 | Jang .................. H01L 29/7926 257/324 |
| 2013/0307050 | A1* | 11/2013 | Ahn .................. H01L 27/11524 257/319 |
| 2013/0313627 | A1 | 11/2013 | Lee et al. |
| 2014/0008714 | A1 | 1/2014 | Makala et al. |
| 2014/0035026 | A1* | 2/2014 | Jang .................. H01L 29/792 257/324 |
| 2014/0225181 | A1 | 8/2014 | Makala et al. |
| 2014/0264533 | A1 | 9/2014 | Simsek-Ege et al. |
| 2014/0264542 | A1 | 9/2014 | Simsek-Ege et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Au, Y. et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

M. Claes et al., "Selective Wet Etching of Hf-based Layers," Abstracts, 204th Meeting of the Electrochemical Society, 2003.

Endoh, et al., "Novel Ultra High Density Memory with a Stacked-Surrounding Gate Transistor (S-SGT) Structured Cell," IEDM Proc. (2001) 33-36.

U.S. Appl. No. 13/762,988, filed Feb. 8, 2013, SanDisk Technologies Inc.

U.S. Appl. No. 14/133,979, filed Dec. 19, 2013, SanDisk Technologies Inc.

U.S. Appl. No. 14/183,152, filed Feb. 18, 2014, SanDisk Technologies Inc.

U.S. Appl. No. 14/219,161, filed Mar. 19, 2014, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

(56) References Cited

OTHER PUBLICATIONS

U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.
U.S. Appl. No. 14/319,283, filed Jun. 30, 2014, SanDisk Technologies Inc.
U.S. Appl. No. 14/456,515, filed Aug. 11, 2014, SanDisk Technologies Inc.
Rem, J. B. et al., "Incubation Time Measurements in Thin-Film Deposition," J. Electrochem. Soc., vol. 144, No. 6, pp. 2101-2106 (1997).
U.S. Appl. No. 14/560,308, filed Dec. 4, 2014, San Disk Technologies Inc.
U.S. Appl. No. 14/560,351, filed Dec. 4, 2014, San Disk Technologies Inc.

\* cited by examiner

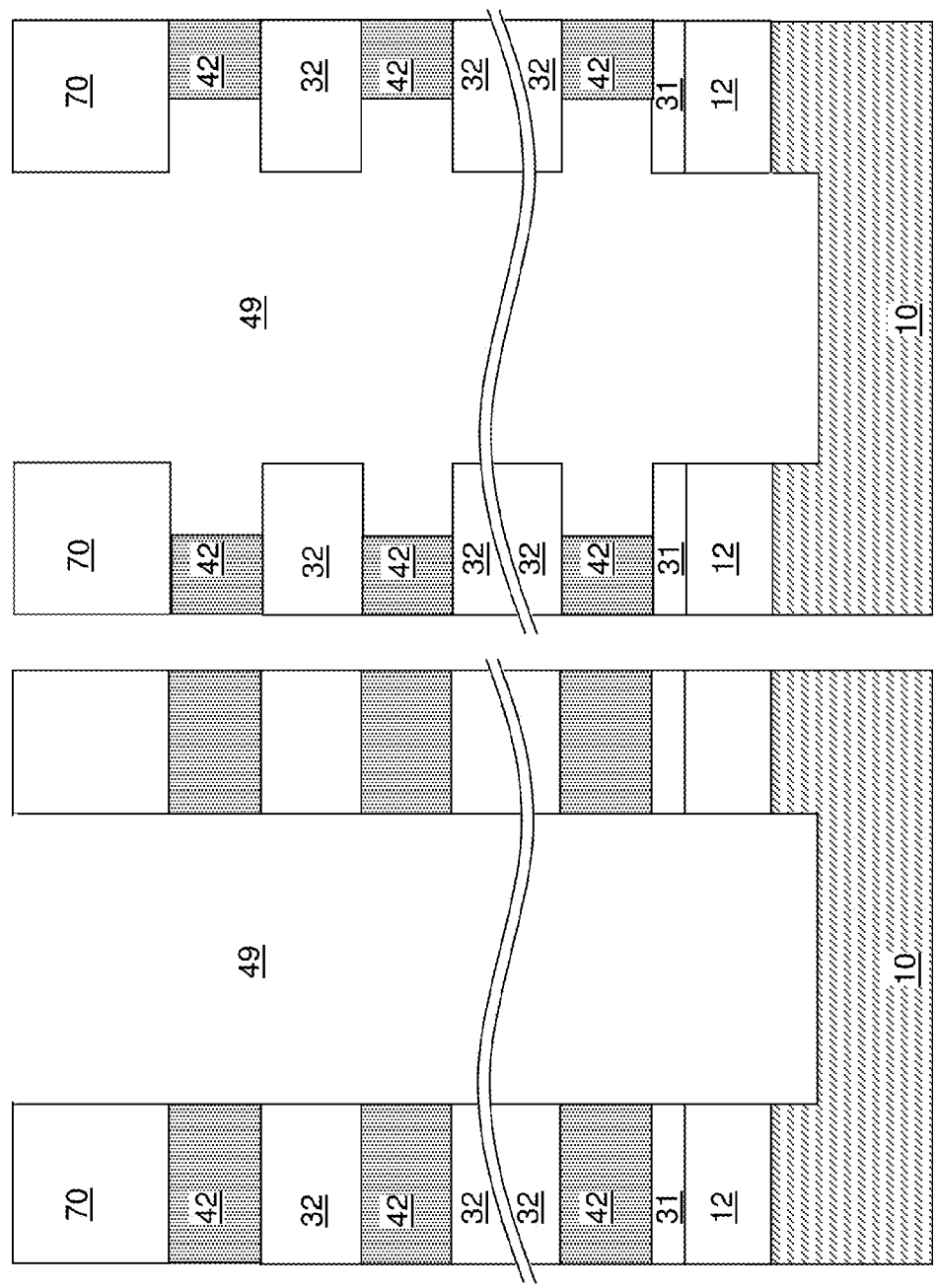

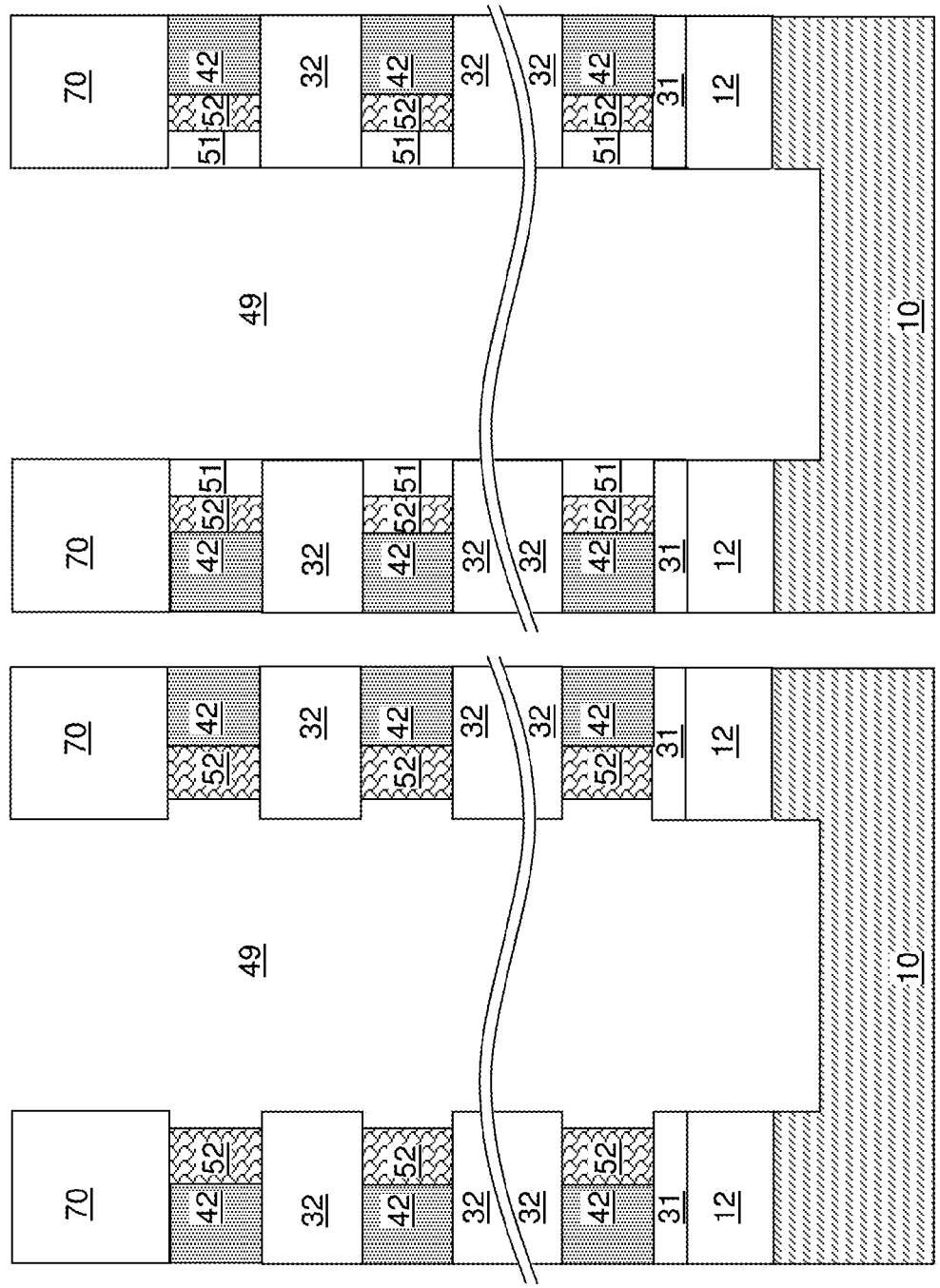

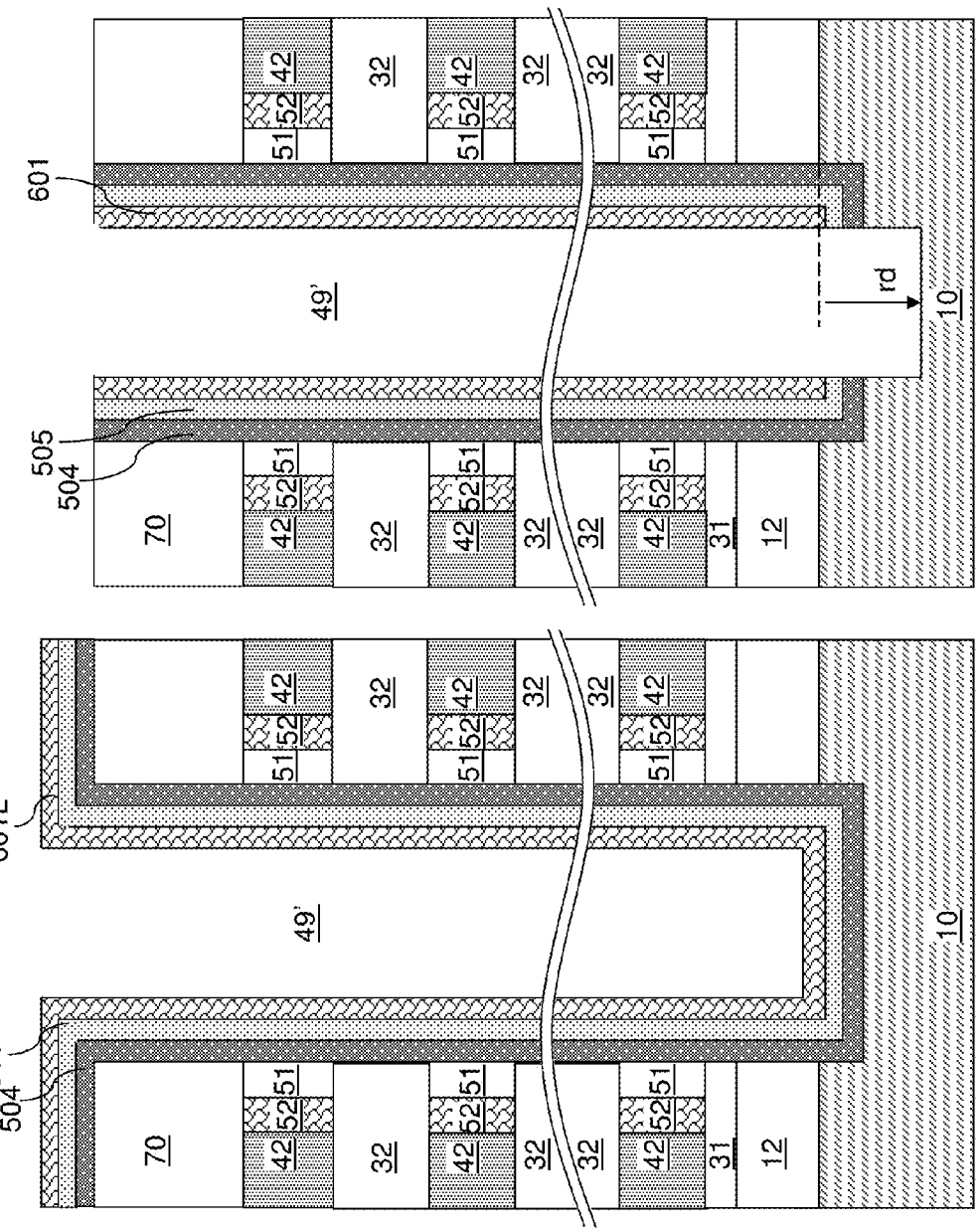

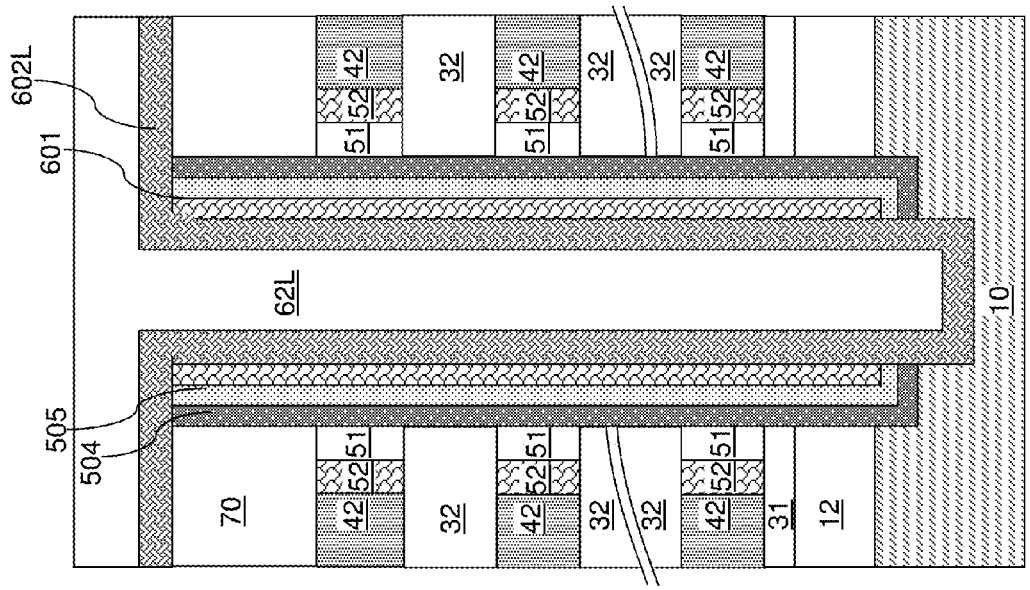
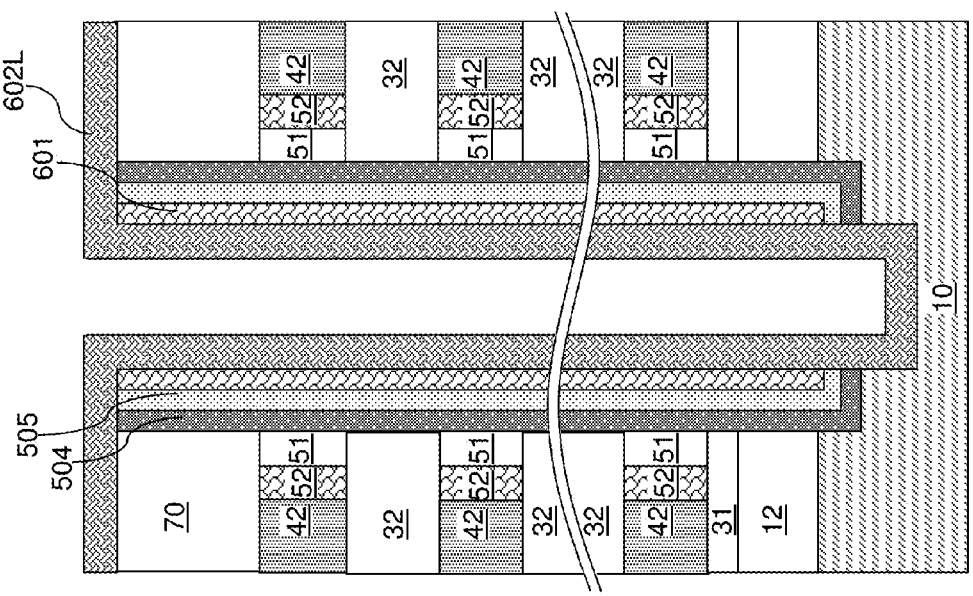

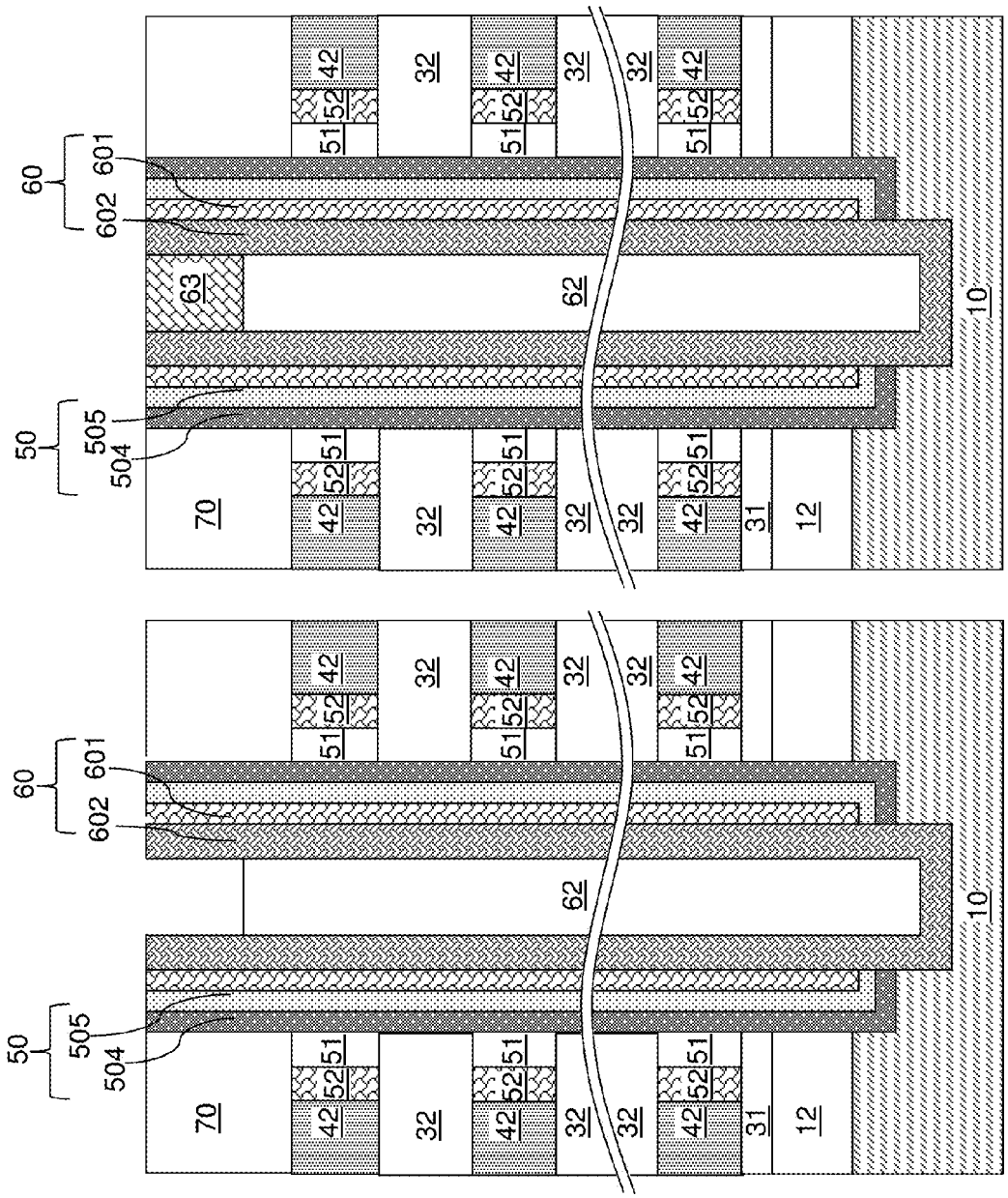

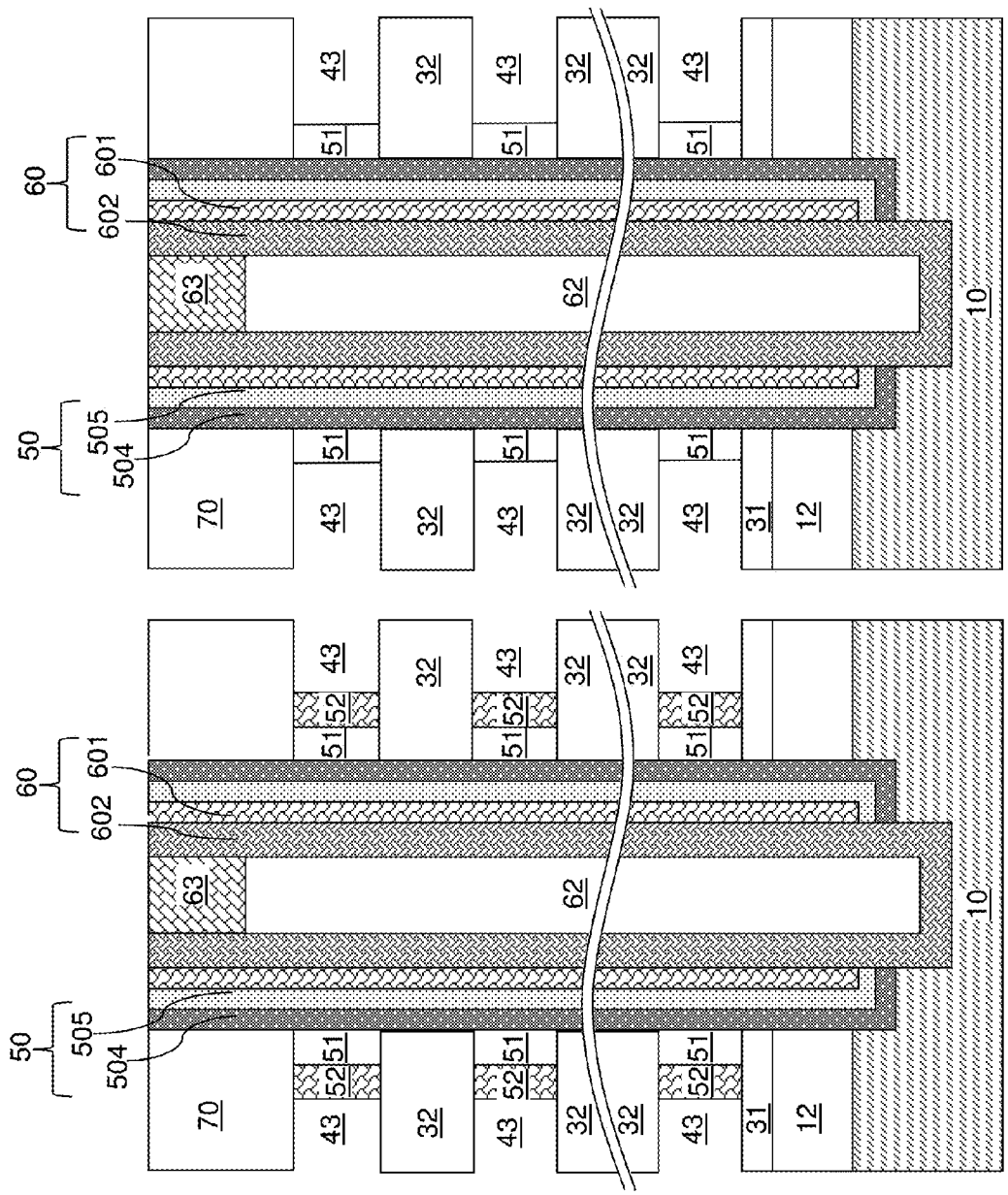

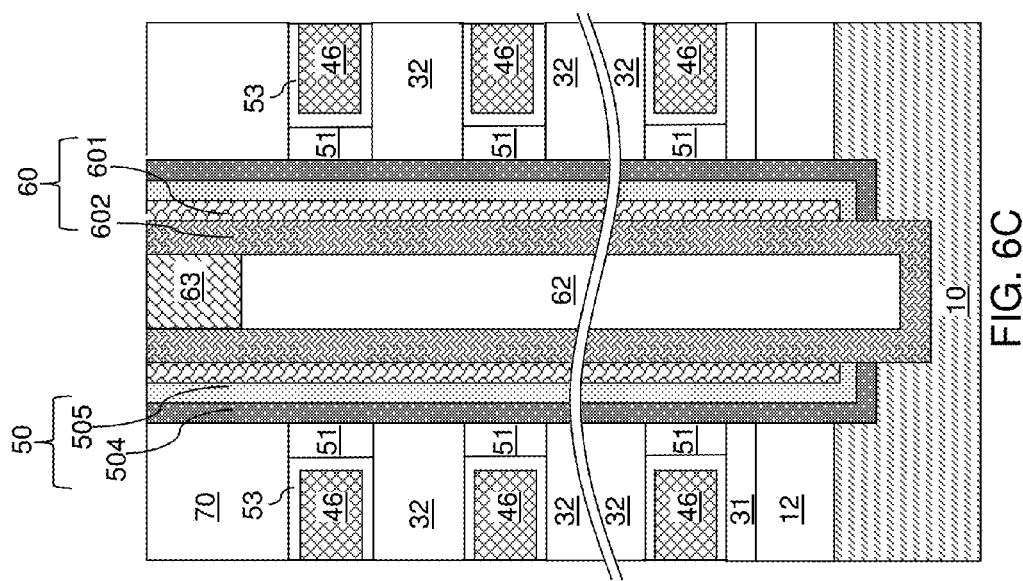

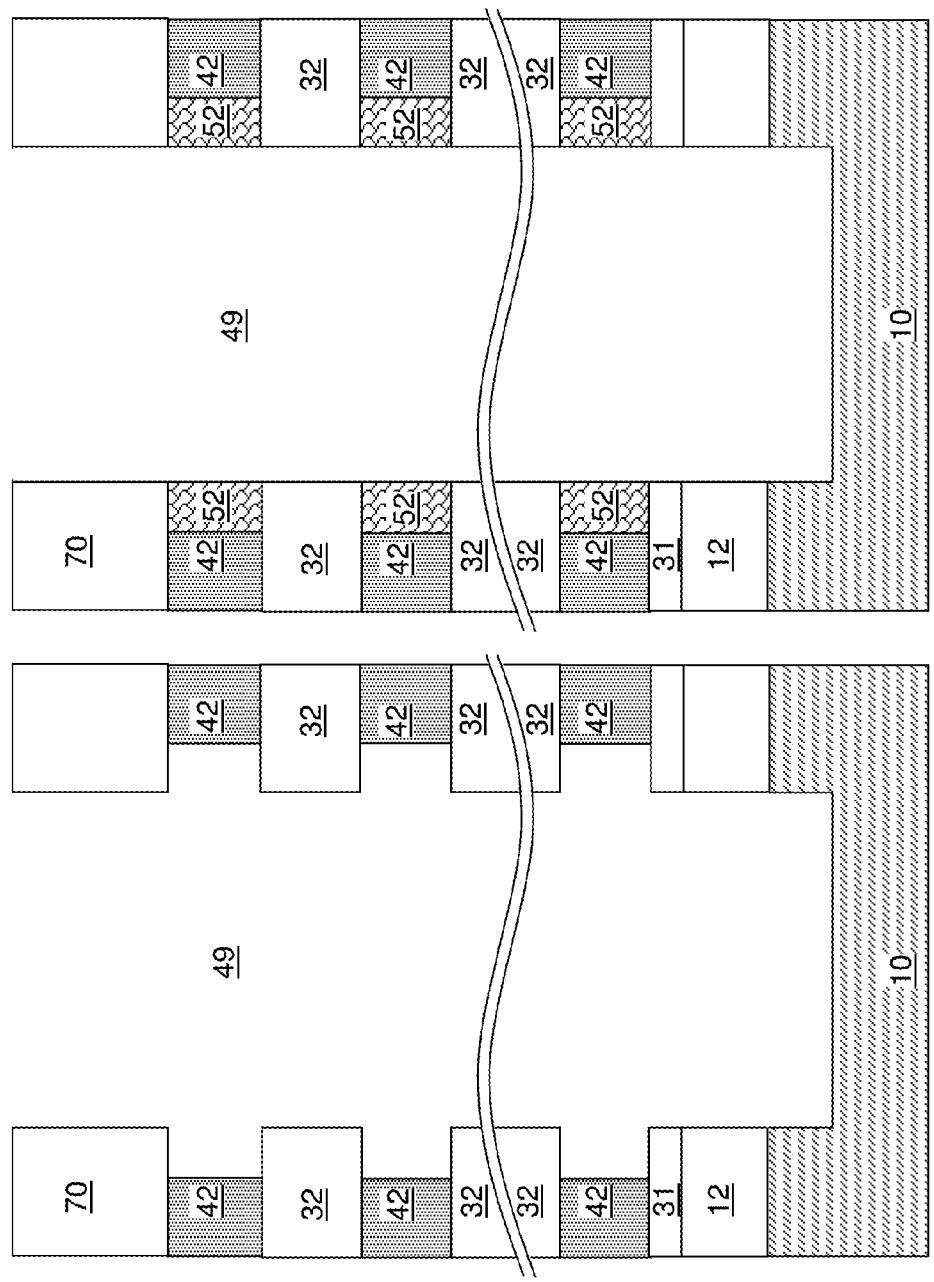

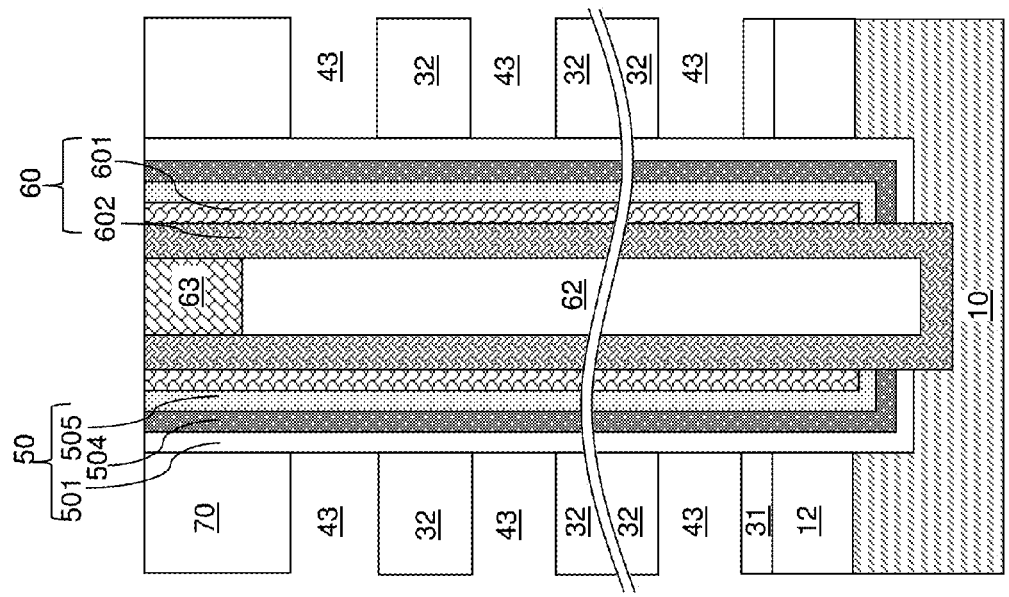
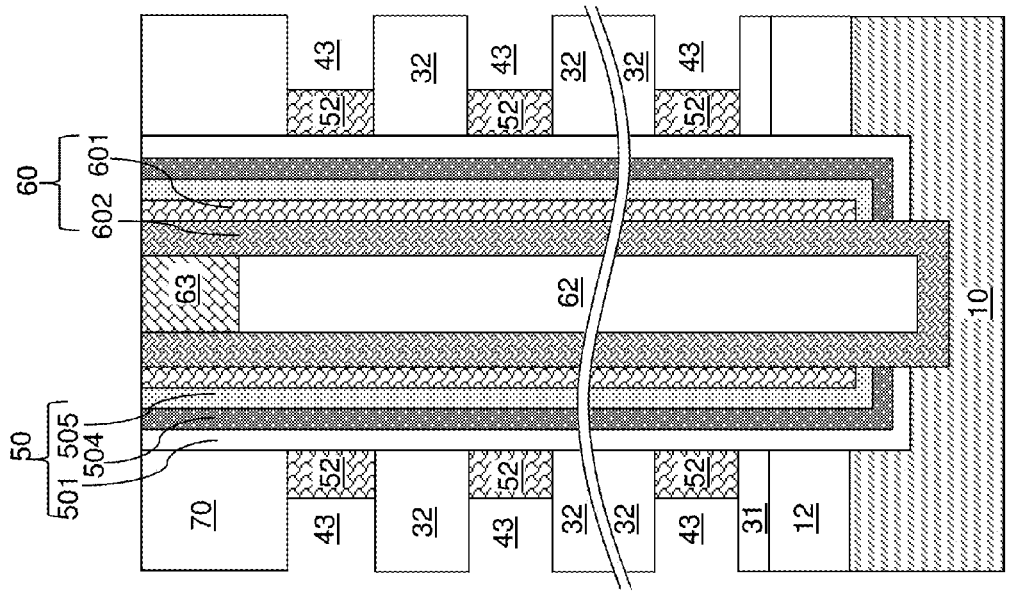

UNIFORM THICKNESS BLOCKING DIELECTRIC PORTIONS IN A THREE-DIMENSIONAL MEMORY STRUCTURE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of manufacturing a three-dimensional memory device is provided. A stack of alternating layers comprising first material layers and second material layers over a substrate. A memory opening is formed through the stack. Sidewall surfaces of the second material layers are laterally recessed with respect to sidewall surfaces of the first material layers within the memory opening. Annular semiconductor material portions are formed by depositing a semiconductor material from the sidewall surfaces of the second material layers while the semiconductor material does not grow from surfaces of the first material layers. A memory film is formed over inner surfaces of the annular dielectric material portions.

According to another aspect of the present disclosure, a method of manufacturing a three-dimensional memory device is provided. A stack of alternating layers comprising first material layers and second material layers is formed over a substrate. A memory opening is formed through the stack. Sidewall surfaces of the second material layers are laterally recessed with respect to sidewall surfaces of the first material layers within the memory opening. Annular semiconductor material portions are formed on the sidewall surfaces of the second material layers. The annular semiconductor material portions are subsequently removed.

According to yet another aspect of the present disclosure, a monolithic three-dimensional NAND memory device is provided, which comprises a stack of alternating layers comprising insulator layers and electrically conductive layers and located over a substrate, a memory opening extending through the stack, a memory film and a semiconductor channel located within the memory opening, and a plurality of vertically spaced blocking dielectric portions contacting an outer sidewall of the memory film and located at same levels as the electrically conductive layers. Each electrically conductive layer is laterally spaced from the memory film by one of the blocking dielectric portions. An outermost surface of each blocking dielectric portion is not located farther away from the memory film than an innermost surface of a respective electrically conductive layer that is located at a same level.

BRIEF DESCRIPTION OF THE DRAWINGS

FIGS. 2A-2J are sequential vertical cross-sectional views of a memory opening within the exemplary structure during various processing steps employed to form a first exemplary memory stack structure according to the first embodiment of the present disclosure.

FIGS. 6A-6C are sequential vertical cross-sectional views of a memory opening within the exemplary structure during various processing steps employed to form electrically conductive layers according to the first embodiment of the present disclosure.

FIGS. 10A-10D are sequential vertical cross-sectional views of a memory opening within the exemplary structure during various processing steps employed to form a second exemplary memory stack structure according to a second embodiment of the present disclosure.

FIGS. 11A-11C are sequential vertical cross-sectional views of a memory opening within the exemplary structure during various processing steps employed to form electrically conductive layers according to the second embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
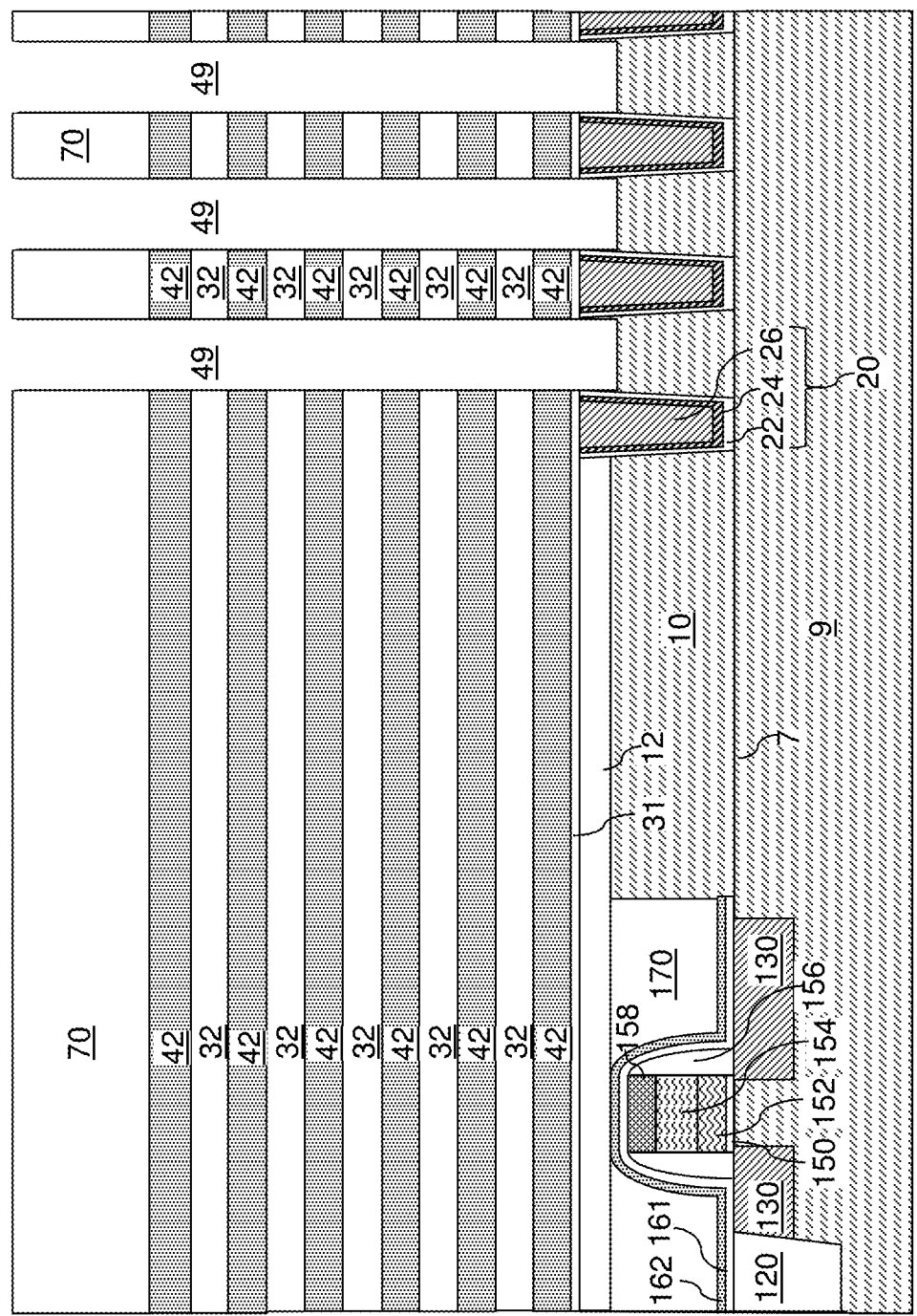
FIG. 1 is a vertical cross-sectional view of an exemplary structure after formation of a stack including an alternating plurality of material layers and memory openings extending through the stack according to a first embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). First exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10.

Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an first exemplary memory stack structure according to a first embodiment of the present disclosure. Formation of the first exemplary memory stack structure can be performed within each of the memory openings 49 in the exemplary structure illustrated in FIG. 1.

FIGS. 2A-2H illustrate a memory opening during formation of a first exemplary memory structure therein. Referring to FIG. 2A, a memory opening 49 is illustrated as formed at the end of the processing steps of FIG. 1. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed.

Referring to FIG. 2B, the sacrificial material layers 42 can be laterally recessed partially to form lateral recesses. Specifically, sidewall surfaces of the second material layers (e.g., the sacrificial material layers 42) are laterally recessed with respect to sidewall surfaces of the first material layers (e.g., the insulator layers 32) within each memory opening 49. An isotropic etch process can be employed to recess the sidewalls of the second material layers. The isotropic etch process employs an isotropic etch chemistry that selectively etches the second material of the second material layers selective to the first material of the first material layers. In one embodiment, the sacrificial material layers 42 can include silicon nitride and the insulator layers 32 can include silicon oxide, and the isotropic etch chemistry can employ phosphoric acid that etches silicon nitride selective to silicon oxide. In another embodiment, the sacrificial material layers 42 can include germanium or a germanium-containing alloy and the insulator layers 32 can include silicon oxide or silicon nitride, and the isotropic etch chemistry can employ a combination of hydrogen peroxide and hydrofluoric acid that etches germanium or the germanium-containing alloy selective to silicon oxide and silicon nitride. The recess distance, which is the lateral distance between sidewalls of the insulator layers 32 and the sidewalls of the sacrificial material layers 42 after formation of the lateral recesses, can be in a range from 1 nm to 60 nm, although lesser and greater recess distances can also be employed. In one embodiment, the recess distance can be in a range from 3 nm to 30 nm.

Referring to FIG. 2C, a selective semiconductor deposition process can be performed to form a plurality of annular semiconductor material portions 52 within each lateral recess around the memory opening 49. Specifically, the exemplary semiconductor structure (which includes a combination of the substrate (9, 10) and the stack (32, 42)) is placed in a process chamber. A semiconductor precursor gas and an etchant gas are flowed into the process chamber concurrently or alternately during the selective deposition process. During the selective deposition process, a semiconductor material derived from the semiconductor precursor gas nucleates at different rates on different types of surfaces during the selective semiconductor deposition process. The flow rate of the etchant gas and/or the duration of the flow of the etchant gas are controlled such that net deposition occurs on the sidewall surfaces of the second material layers (e.g., the sacrificial material layers 42) while the semiconductor material does not grow from surfaces of the first material layers (e.g., the insulator layers 32). By setting the etch rate of the etchant gas between the deposition rate of the semiconductor material on the insulator layers 32 and the deposition rate of the semiconductor material on the sacrificial material layers 42, the annular semiconductor material portions 52 can be formed by net deposition of the semiconductor material on the sidewall surfaces of the sacrificial material layers 42 while the semiconductor material does not grow from surfaces of the insulator layers 32.

In one embodiment, the first material layers (e.g., the insulator layers 32) comprise silicon oxide layers and the second material layers (e.g., the sacrificial material layers 42) comprise silicon nitride layers, and the plurality of annular semiconductor material portions 52 can be formed only on surfaces of the silicon nitride layers. In another embodiment, the first material layers (e.g., the insulator layers 32) comprise silicon oxide layers or silicon nitride layers and the second material layers (e.g., the sacrificial material layers 42) comprise germanium or a germanium-containing alloy, and the plurality of annular semiconductor material portions 52 can be formed only on surfaces of the sacrificial material layers 42. In one embodiment, the plurality of annular semiconductor material portions 52 can have lesser germanium content than the sacrificial material layers 42. In one embodiment, the plurality of annular semiconductor material portions 52 can be an amorphous silicon portion that is substantially free of germanium, and the sacrificial material layers 52 can include germanium at a concentration above trace level. The lateral thickness of each annular semiconductor material portion 52 can be in a range from 1 nm to 40 nm, although lesser and greater lateral thicknesses can also be employed. In one embodiment, the lateral thickness can be in a range from 3 nm to 20 nm.

Referring to FIG. 2D, an inner portion of each annular semiconductor material portion 52 exposed in the memory opening can be converted into an annular dielectric material portion 51 that includes a dielectric material. An outer portion of each annular semiconductor material portion 52 is not converted into the dielectric material. Thus, a plurality of vertically spaced nested structures are formed such that each nested structure includes an annular semiconductor material portion 52 having an inner sidewall that contacts an outer sidewall of an annular dielectric material portion 51. The inner portion of each annular semiconductor material portion 52 can be converted into a respective annular dielectric material portion 51 employing at least one process selected from thermal oxidation, thermal nitridation, plasma oxidation, plasma nitridation, and a combination thereof. If a thermal oxidation process is employed, the thermal oxidation process can include in-situ steam generation (ISSG) thermal oxidation, wet oxidation in a furnace or a single wafer processing tool, or dry oxidation in a furnace or a single wafer processing tool. The lateral thickness of each annular dielectric material portion 51 can be in a range from 1 nm to 20 nm, although lesser and greater lateral thicknesses can also be employed. In one embodiment, the lateral thickness can be in a range from 2 nm to 10 nm.

Each annular dielectric material portion 51 can function as a blocking dielectric portion for the first exemplary memory stack structure to be subsequently formed in a memory opening 49. The plurality of the annular dielectric material portions 51 includes a dielectric material that is an oxide, a nitride, or an oxynitride of the semiconductor material of the plurality of annular semiconductor material portions 52. Thus, when the plurality of annular semiconductor material portions 52 comprise silicon, the annular dielectric material portions 51 comprise silicon oxide, silicon nitride or silicon oxynitride. In an embodiment, the plurality of annular semiconductor material portions 52 comprise amorphous silicon and the annular dielectric material portions 51 comprise silicon oxide (e.g., silicon dioxide).

Referring to FIG. 2E, a series of layers constituting a memory film can be subsequently formed on inner surfaces of the annular dielectric material portions 51. Specifically, at least one charge storage element as embodied in a memory material layer 504, a tunneling dielectric layer 505L, and an optional first semiconductor channel layer 601L can be sequentially deposited in the memory openings 49.

In one embodiment, the memory material layer 504 can be a charge trapping layer including a dielectric charge trapping material, which can be, for example, silicon nitride. Alternatively, the memory material layer 504 can include a conductive material such as doped polysilicon or a metallic material that may be optionally patterned into multiple electrically isolated portions (e.g., floating gates), for example, by being formed within the lateral recesses into sacrificial material layers 42. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (504, 5051, 601L).

Referring to FIG. 2F, the optional first semiconductor channel layer 601L, the tunneling dielectric layer 505L, and the memory material layer 504 are sequentially anisotropically etched employing at least one anisotropic etch process. The portions of the first semiconductor channel layer 601L, the tunneling dielectric layer 505L, and the memory material layer 504 located above the top surface of the insulating cap layer 70 can be removed by the at least one anisotropic etch process. Further, the horizontal portions of the first semiconductor channel layer 601L, the tunneling dielectric layer 505L, and the memory material layer 504 at a bottom of each cavity 49' can be removed to form openings in remaining portions thereof. Each of the first semiconductor channel layer 601L, the tunneling dielectric layer 505L, and the memory material layer 504 can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504 constitutes at least one charge storage element, which can be a plurality of charge storage elements. In one embodiment, the memory material layer 504 can be a contiguous charge storage layer. A surface of the semiconductor material layer 10 can be physically exposed underneath the opening through the first semiconductor channel portion 601, the tunneling dielectric 505, and the memory material layer 504. Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance rd. The tunneling dielectric 505 is embedded within the memory material layer 504. The memory material layer 504 can comprise a charge trapping material or a floating gate material.

In one embodiment, the first semiconductor channel portion 601, the tunneling dielectric 505, and the memory material layer 504 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2G, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2H, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2I, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a memory material layer 504, and laterally surrounds a portion of the semiconductor channel 60. Each adjoining set of a memory material layer 504, and a tunneling dielectric 505 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2J, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
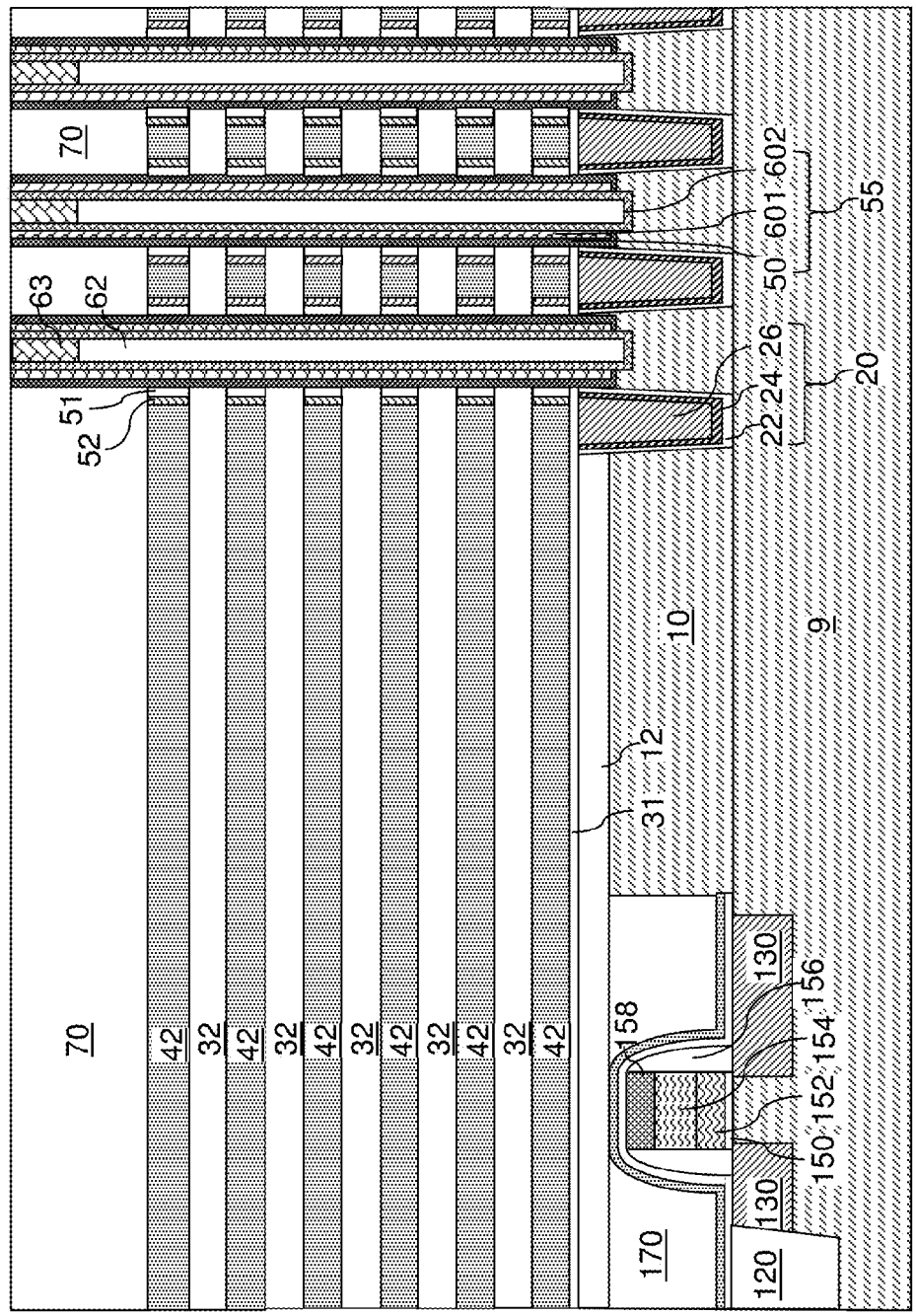
FIG. 3 is a vertical cross-sectional view of the exemplary structure after formation of memory stack structures according to the first embodiment of the present disclosure.

The first exemplary memory stack structure can be embedded into the exemplary structure illustrated in FIG. 1. FIG. 3 illustrates the exemplary structure that incorporates multiple instances of the first exemplary memory stack structure of FIG. 2J. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). While the present disclosure is described employing the illustrated configuration for the memory stack structure, the methods of the present disclosure can be applied to alternative memory stack structures including a polycrystalline semiconductor channel.

Figure 4:
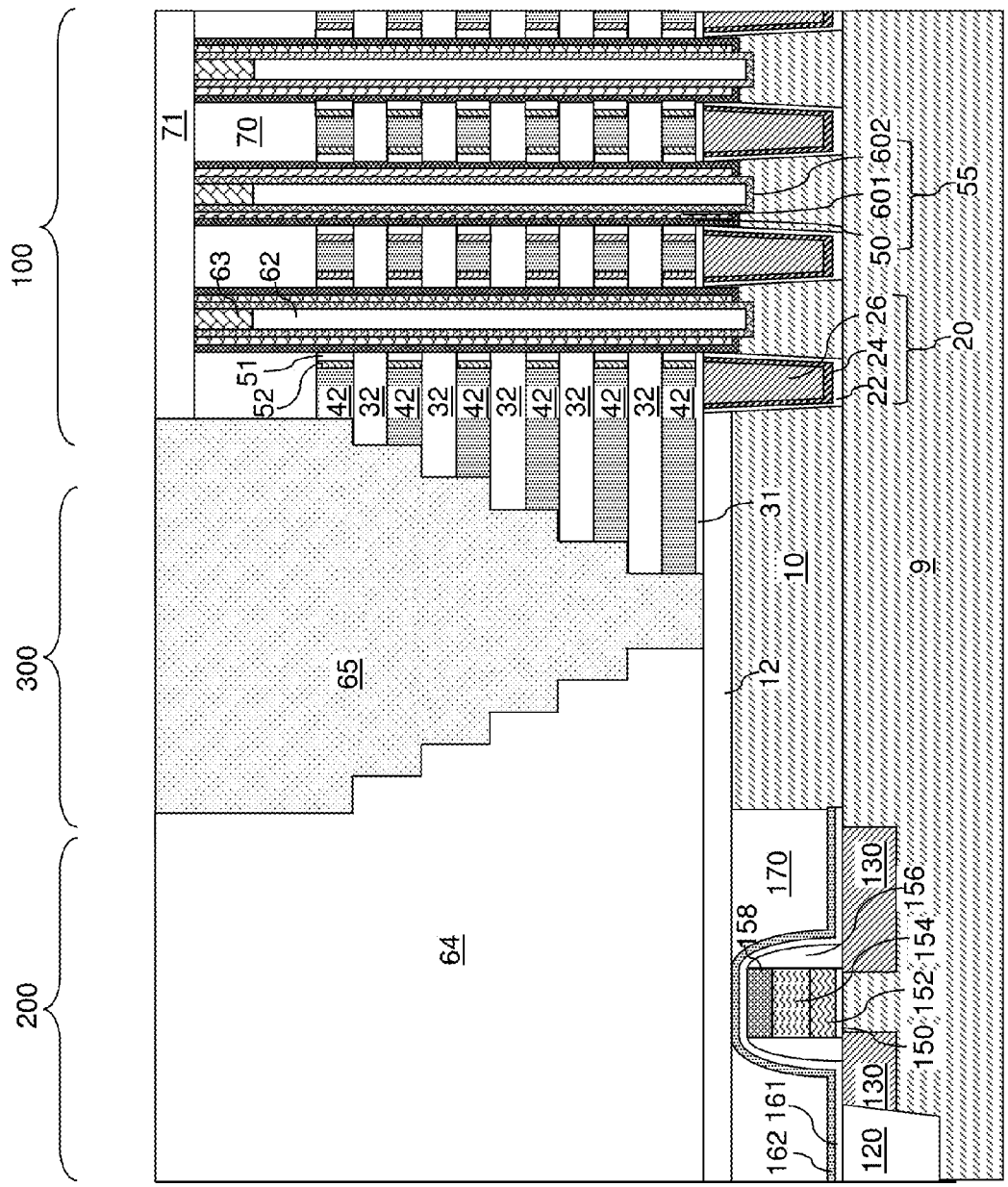
FIG. 4 is a vertical cross-sectional view of the exemplary structure after formation of a stepped terrace and a retro-stepped dielectric material portion according to the first embodiment of the present disclosure.

Referring to FIG. 4, at least one dielectric cap layer 71 can be optionally formed over the planarization dielectric layer 70. Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
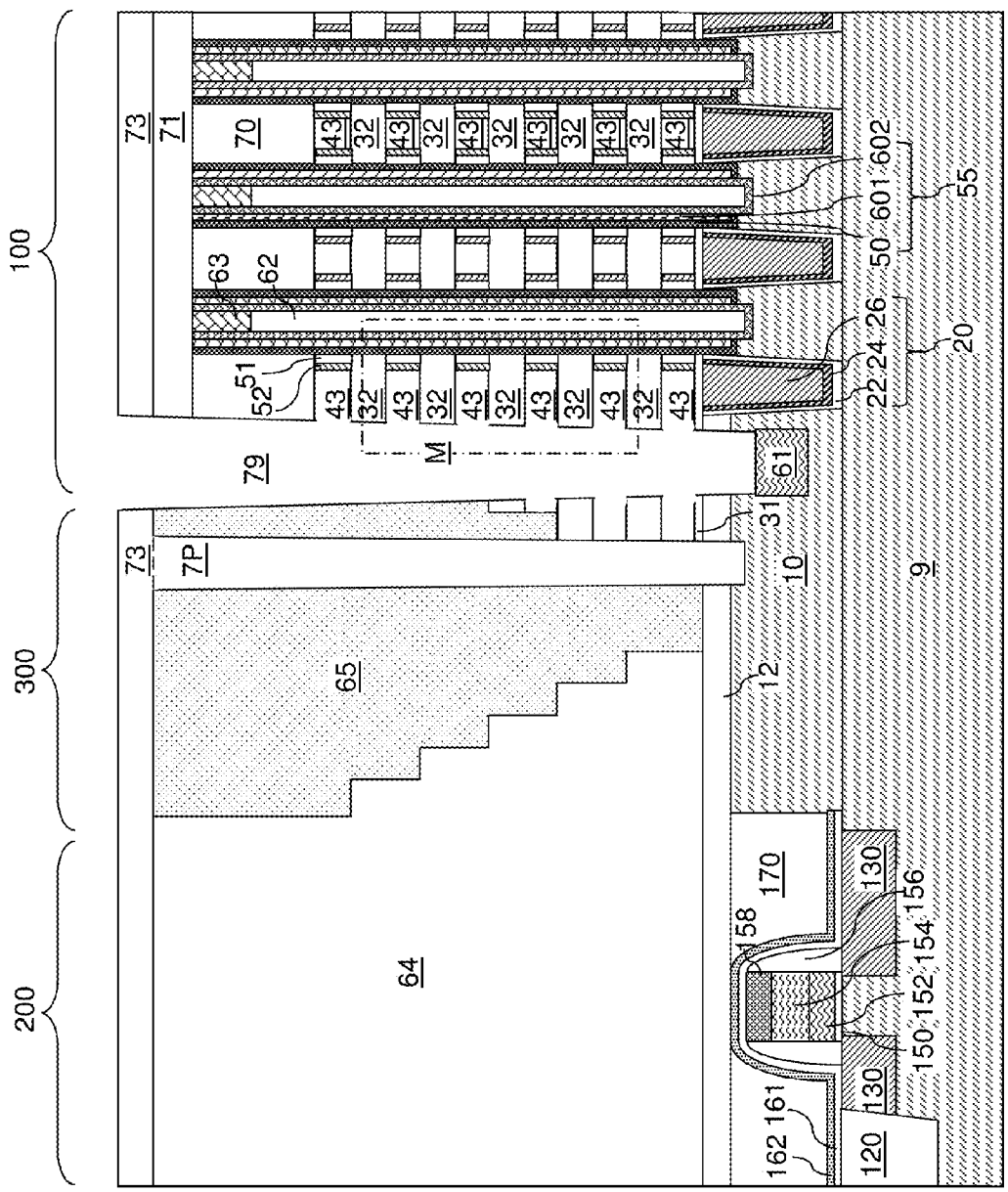
FIG. 5A is a vertical cross-sectional view of the exemplary structure after formation of a backside via cavity and backside recesses according to the first embodiment of the present disclosure.
Figure 5B:
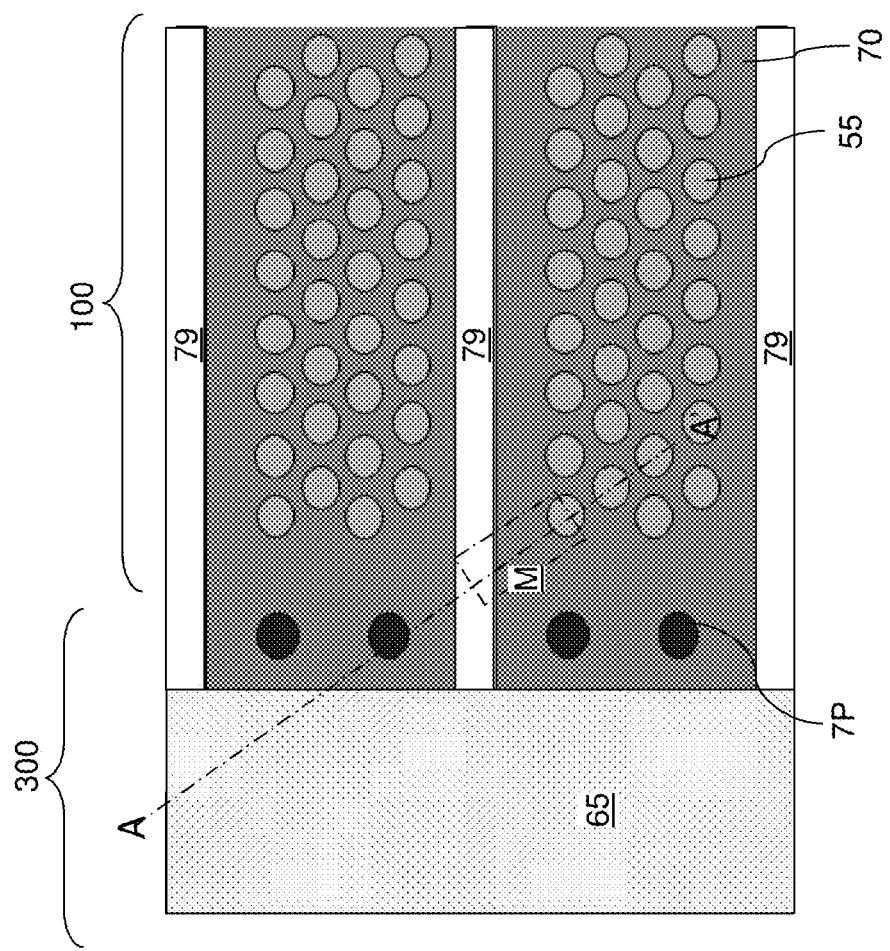
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the alternating stack (32, 42). The plane A-A' in FIG. 5B corresponds to a plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region 61 may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses.

Referring to FIG. 6A, a magnified region M in FIGS. 5A and 5B is shown in a magnified view after formation of the backside recesses 43 by removal of the second material layers (i.e., the sacrificial material layers 42) selective to the first material layers (i.e., the insulator layers 32). During removal of the second material layers (i.e., the sacrificial material layers 42), the second material layers are removed employing an etch chemistry that is selective to the semiconductor material of the annular semiconductor material portions 52. For example, if the insulator layers 32 comprise silicon oxide and the sacrificial material layers 42 comprise silicon nitride, a wet etch employing phosphoric acid can be employed to etch the sacrificial material layers 42 selective to the insulator layers 32 and the plurality of annular semiconductor material portions 52. In another example, the insulator layers 32 comprise silicon nitride or silicon oxide, the sacrificial material layers 42 comprise germanium or a germanium-containing alloy, and the plurality of annular semiconductor material portions comprises amorphous silicon or polycrystalline silicon. In this case, a wet etch process employing hydrogen peroxide and optionally ammonium hydroxide can be performed to etch the sacrificial material layers 42 selective to the insulator layers 32 and the plurality of annular semiconductor material portions 52.

Referring to FIG. 6B, the semiconductor material of the annular semiconductor material portions 52 can be removed employing another etch chemistry that is selective to the dielectric material of the annular dielectric material portions 51. For example, if the annular semiconductor material portions 52 comprise silicon and the annular dielectric material portions 51 comprise silicon oxide, silicon nitride, or silicon oxynitride, the annular semiconductor material portions 52 (e.g., amorphous silicon portions 52) can be selectively removed by a selective isotropic etch employing an alkaline organic etch solution, such as a TMY etching solution. The TMY etching solution contains a solution of trimethyl-2 hydroxyethyl ammonium hydroxide (also known as (2-hydroxyethyl)trimethylammonium hydroxide or choline hydroxide). Outer sidewalls of the annular dielectric material portions 51 are physically exposed to the backside recesses 43.

The annular semiconductor material portions 52 act as an etch stop when etching the sacrificial material layers 42 and prevents over etching damage to the blocking dielectric 51 during etching of the sacrificial material layers. In one embodiment, the etching of silicon nitride layers 42 by phosphoric acid is stopped by the amorphous silicon portions 52. Subsequently, the amorphous silicon portions 52 are selectively removed by the TMY etch. Even though the silicon oxide blocking dielectric 51 is exposed to the TMY etching solution, the selectivity of TMY for etching amorphous silicon compared to for etching silicon oxide is high (e.g., higher than the selectivity of phosphoric acid for etching silicon nitride compared to for etching silicon oxide). In addition, the etching amount using TMY is much smaller compared to the etching amount using phosphoric acid. Therefore, by adding the sacrificial amorphous silicon etch stop regions 52 between the silicon nitride layers 42 and the silicon oxide blocking dielectric 51, the over etch damage to the blocking dielectric 51 by the phosphoric acid etch of the silicon nitride layers 42 is reduced or eliminated. As a result, the undesirable variation in the thickness of the blocking dielectric 51 is reduced compared to a process in which the sacrificial etch stop regions 52 are not used.

Figure 7:
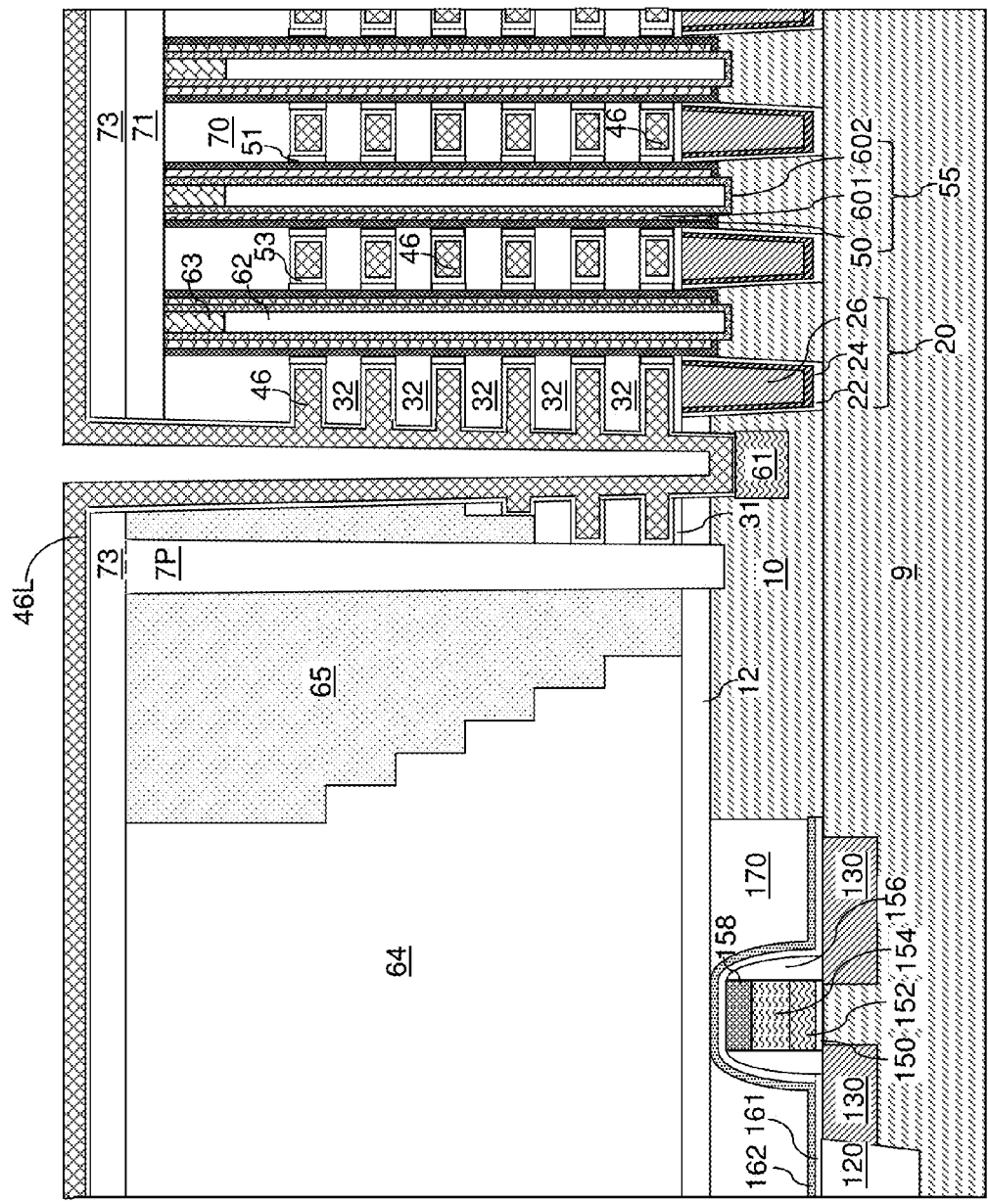
FIG. 7 is a vertical cross-sectional view of the exemplary structure after formation of the electrically conductive lines according to the first embodiment of the present disclosure.

Referring to FIGS. 6C and 7, a backside blocking dielectric layer 53 can be optionally formed in the backside recesses 43. The backside blocking dielectric layer 53 can function as a dielectric material portion which, in combination with the blocking dielectric portions embodied as the annular dielectric material portions 51, blocks leakage of stored electrical charges from the memory material layer 504 to control gate electrodes to be subsequently formed.

In one embodiment, the backside blocking dielectric layer 53 can be deposited on the sidewalls of each backside recess 43 (including an outer sidewall of each annular dielectric material portion 51) by a conformal deposition method. The backside blocking dielectric layer 53 includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the backside blocking dielectric layer 53 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The backside blocking dielectric layer 53 can be deposited, for example, by chemical vapor deposition (CVD), atomic layer deposition (ALD), pulsed laser deposition (PLD), liquid source misted chemical deposition, or a combination thereof. The thickness of the backside blocking dielectric layer 53 can be in a range from 1 nm to 6 nm, although lesser and greater thicknesses can also be employed. In one embodiment, the backside blocking dielectric layer 53 includes aluminum oxide.

Subsequently, a conductive material is deposited in remaining volumes of the plurality of backside recesses 43. The conductive material can be deposited on the sidewalls of the at least one the backside contact trench 79, and over the top surface of the dielectric pillar material layer 73 (or the topmost layer of the exemplary structure in case the dielectric pillar material layer 73 is not employed), and on the surfaces of the backside blocking dielectric layer 53. If the backside blocking dielectric layer 53 is not present, the conductive material can be deposited directly on the outer sidewalls of the annular dielectric material portions 51. As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting first exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

A plurality of electrically conductive layers 46 can be formed in the plurality of backside recesses 43, and a contiguous conductive material layer 46L can be formed on the sidewalls of each backside contact trench 79 and over the dielectric pillar material layer 73 (or the topmost layer of the exemplary structure in case the dielectric pillar material layer 73 is not employed). Thus, at least a portion of each sacrificial material layer 42 can be replaced with an electrically conductive layer 46, which is a conductive material portion.

An outermost surface of each blocking dielectric portion (as embodied as the annular dielectric material portions 51) is not located farther away from a most proximal memory film 50 (i.e., the memory film 50 that is most proximate to the respective annular dielectric material portion 51) than an innermost surface of the most proximate portion of the respective electrically conductive layer 46 that is located at the same level. If a backside blocking dielectric layer 53 is present, the outermost surface of each blocking dielectric portion is closer to the most proximal memory film 50 than the innermost surface of the most proximate portion of the respective electrically conductive layer 46 that is located at the same level by the thickness of the backside blocking dielectric layer 53. If a backside blocking dielectric layer 53 is not present, the outermost surface of each blocking dielectric portion is laterally spaced from the most proximal memory film 50 by a same distance as the innermost surface of the most proximate portion of the respective electrically conductive layer 46 that is located at the same level.

Figure 8:
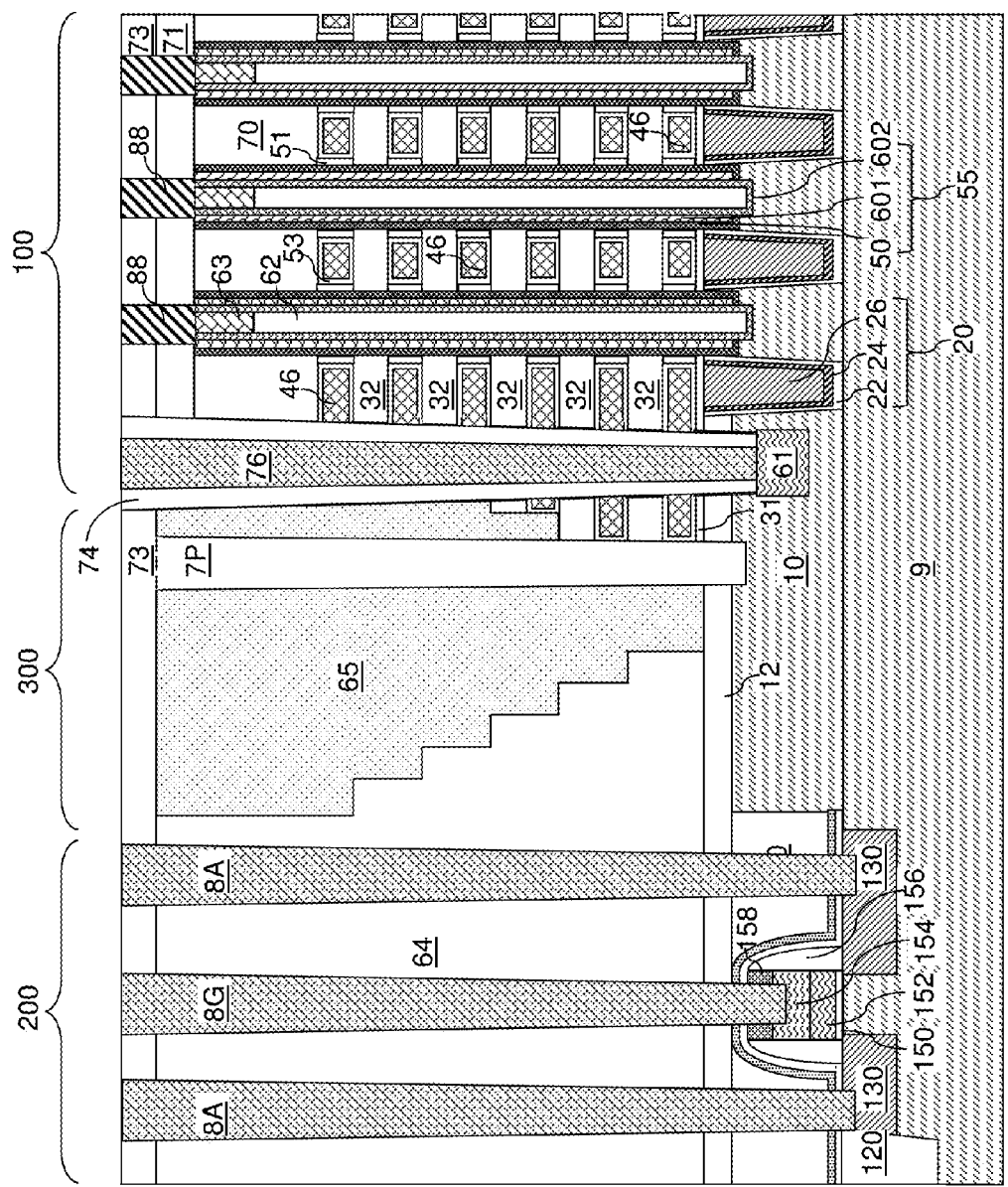
FIG. 8 is a vertical cross-sectional view of the exemplary structure after formation of a backside insulating spacer and a backside contact via structure according to the first embodiment of the present disclosure.

Referring to FIG. 8, the deposited conductive material of the contiguous conductive material layer 46L is etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within the contact region 300 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, another photoresist layer (not shown) can be applied over the exemplary structure, and can be lithographically patterned to form openings that overlie the array of drain regions 63 in the device region 100. Drain contact via cavities can be formed through the dielectric pillar material layer 73 and the at least one dielectric cap layer 71.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures (not shown) can be formed within each contact via cavity that extends to a top surface of the electrically conductive layers 46 in the contact region 300. Similarly, drain contact via structures 88 can be formed to provide electrical contact to the drain regions 63.

Figure 9A:
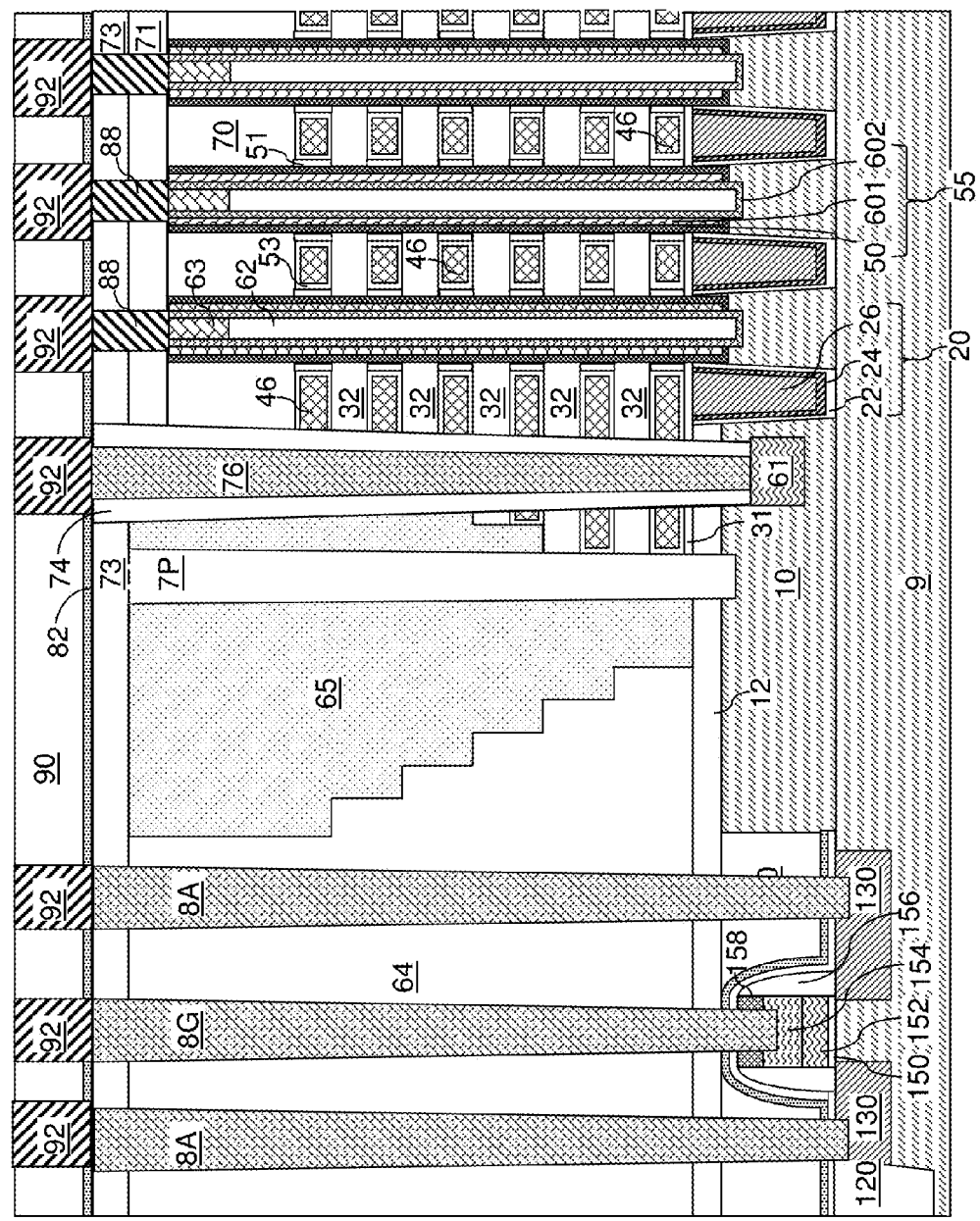
FIGS. 9A and 9B are vertical cross-sectional views of regions of the exemplary structure after formation of conductive line structures according to the first embodiment of the present disclosure.
Figure 9B:
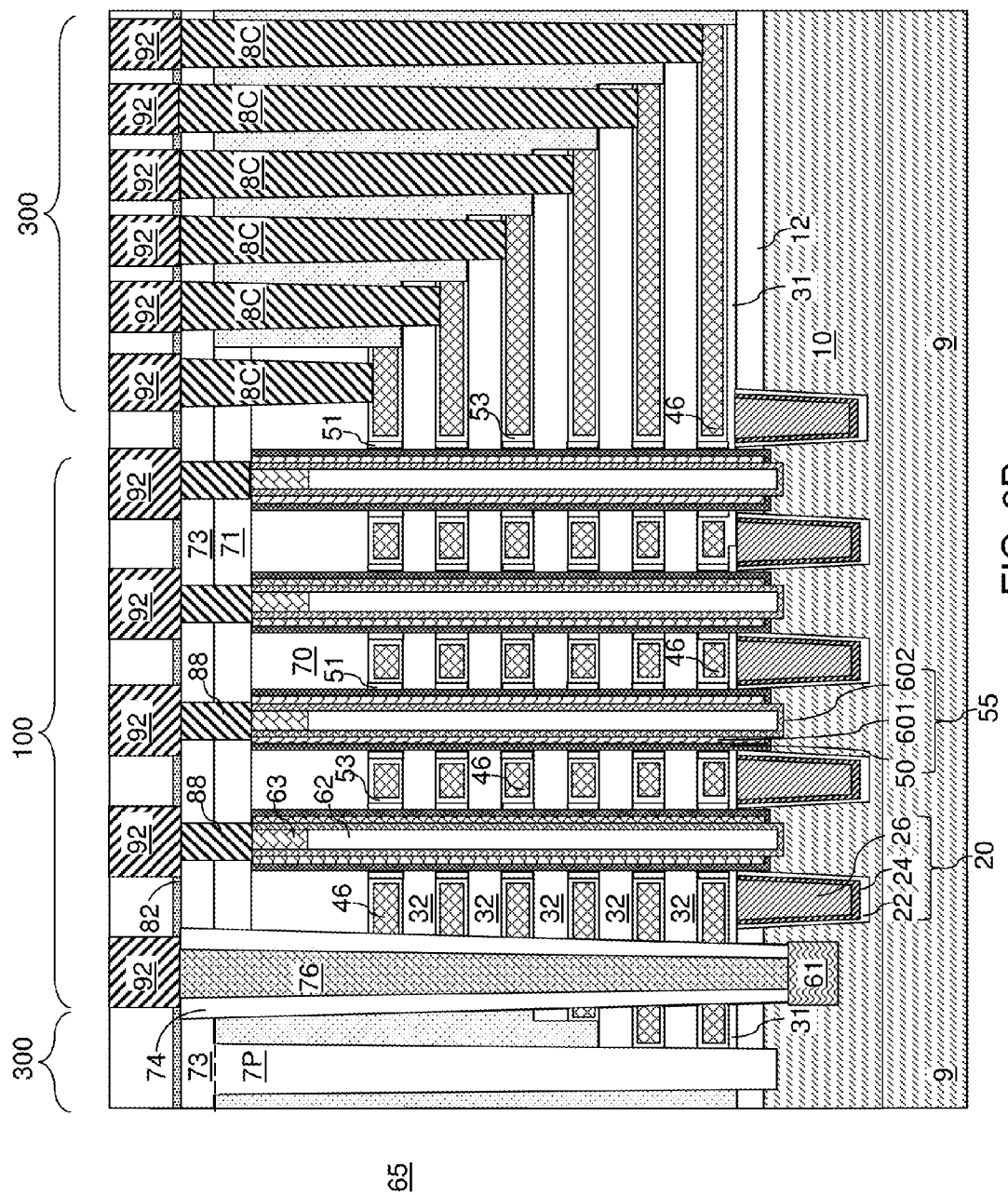

Referring to FIGS. 9A and 9B, an optional passivation layer 82 and a line-level dielectric layer 90 can be formed over the dielectric pillar material layer 73. The optional passivation layer 82 can include a low permeability material such as silicon nitride. As used herein, a low permeability material refers to a material that has hydrogen permeability at room temperature that is less than 100 times the hydrogen permeability of stoichiometric silicon nitride formed by low pressure chemical vapor deposition. The thickness of the passivation layer 82 can be in a range from 3 nm to 30 nm, although lesser and greater thicknesses can also be employed. The line-level dielectric layer 90 can include silicon oxide or organosilicate glass. The thickness of the line-level dielectric layer 90 can be in a range from 30 nm to 1,000 nm, although lesser and greater thicknesses can also be employed.

Various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region 61. The source region 61 can be in contact with the horizontal portion of the semiconductor channel in an upper portion of the semiconductor material layer 10.

A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

The first exemplary structure can comprise a monolithic three-dimensional NAND memory device. The monolithic three-dimensional NAND device includes a stack (32, 46) of alternating layers comprising insulator layers 32 and electrically conductive layers 46 and located over a substrate (9, 10), a memory opening extending through the stack (32, 46), a memory film 50 and a semiconductor channel (601, 602) located within the memory opening, and a plurality of vertically spaced blocking dielectric portions 51 contacting an outer sidewall of the memory film 50 and located at same levels as the electrically conductive layers 46. Each electrically conductive layer 46 is laterally spaced from the memory film 50 by one of the blocking dielectric portions 51. An outermost surface of each blocking dielectric portion 51 is not located farther away from the memory film 50 than an innermost surface of a respective electrically conductive layer 46 that is located at the same level. The semiconductor channel (601, 602) can comprise a portion that vertically extends from a top surface of the substrate (9, 10) to a top surface of the stack (32, 46). The memory film 50 can comprise at least one charge storage element (such as a memory material layer 504) configured to store electrical charges, and a tunneling dielectric 505 in contact with the at least one charge storage element. The monolithic three-dimensional NAND memory device can further comprise a dielectric core 62 comprising a dielectric oxide material and in contact with an inner sidewall of the semiconductor channel (601, 602), a drain region 63 located at a first end of the semiconductor channel (601, 602) and a top surface of the dielectric core 62, and a source region located 61 at a second end of the semiconductor channel (601, 602), which may optionally include a horizontal portion located within the semiconductor material layer 10 (or the semiconductor substrate layer 9 if a semiconductor material layer is not present). In one embodiment, the semiconductor channel (601, 602) can comprise a polycrystalline semiconductor material. The plurality of vertically spaced blocking dielectric portions 51 can comprise a dielectric oxide of a semiconductor element such as silicon.

FIGS. 10A-12 illustrate a method of making a device according to a second embodiment of the disclosure. Referring to FIG. 10A, a memory opening 49 and its vicinity according to a second embodiment of the present disclosure are illustrated at a processing step corresponding to the processing step of FIG. 2B. In the second embodiment, a second exemplary memory stack structure is subsequently formed in the memory opening 49 in lieu of the first exemplary memory stack structure. The sidewall surfaces of the second material layers (i.e., the sacrificial material layers 42) are laterally recessed with respect to the sidewall surfaces of the first material layers (i.e., the insulator layers 32) employing an isotropic etch chemistry, which can be the same as in the processing steps of FIG. 2B.

Referring to FIG. 10B, a plurality of vertically spaced annular semiconductor material portions 52 are formed in the same manner as in the first embodiment. The processing steps of FIG. 2C can be employed to form the plurality of vertically spaced annular semiconductor material portions 52.

The second embodiment differs from the first embodiment in that the annular dielectric material portions 51 of the blocking dielectric are omitted and are optionally replaced by a continuous blocking dielectric layer which extends the entire height of the memory opening 49. Referring to FIG. 10C, a blocking dielectric layer 501 can be formed on inner sidewalls of the annular semiconductor material portions 52. The blocking dielectric layer 501 can include silicon oxide, a dielectric metal oxide, silicon oxynitride, silicon nitride, or a combination or a stack thereof. In one embodiment, the blocking dielectric layer 501 can include a dielectric metal oxide. If the blocking dielectric layer 501 includes a dielectric metal oxide, the dielectric metal oxide of the blocking dielectric layer 501 can include any material that can be employed for the backside blocking dielectric layer 53 of the first embodiment. The blocking dielectric layer 501 can be formed by a conformal deposition method such as low pressure chemical vapor deposition, atomic layer deposition, or a combination thereof. The thickness of the blocking dielectric layer 501 can be in a range from 1 nm to 20 nm, although lesser and greater thicknesses can also be employed. Alternatively, the blocking dielectric layer 501 may be omitted, and a backside blocking dielectric layer can be formed after formation of backside recesses on physically exposed surfaces of a memory material layer.

Subsequently, a memory material layer 504, a tunneling dielectric layer 505L, and a first semiconductor channel layer 601L can be deposited employing the processing steps of FIG. 2E.

Figure 10D:
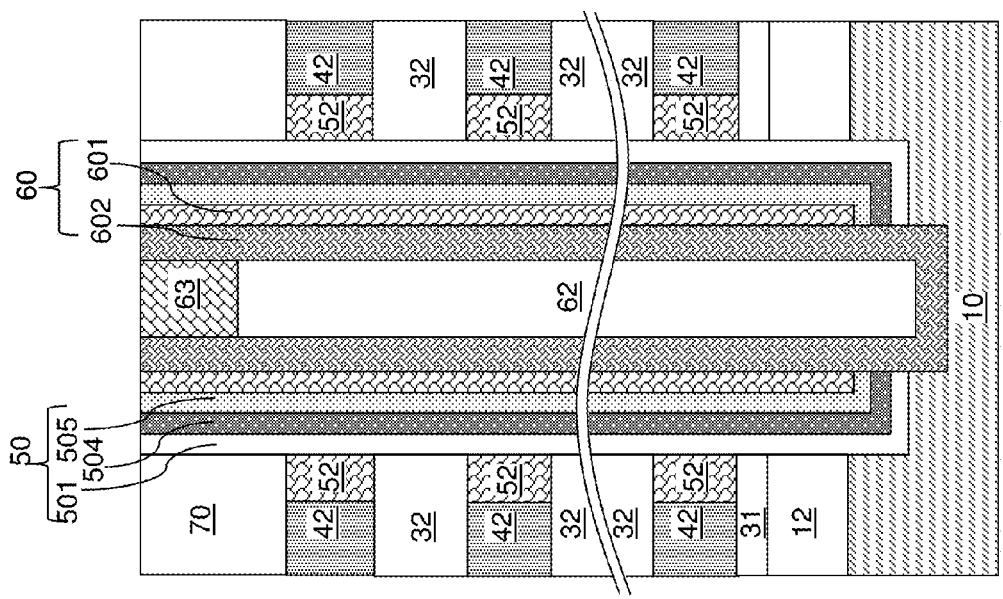
Figure 10C:
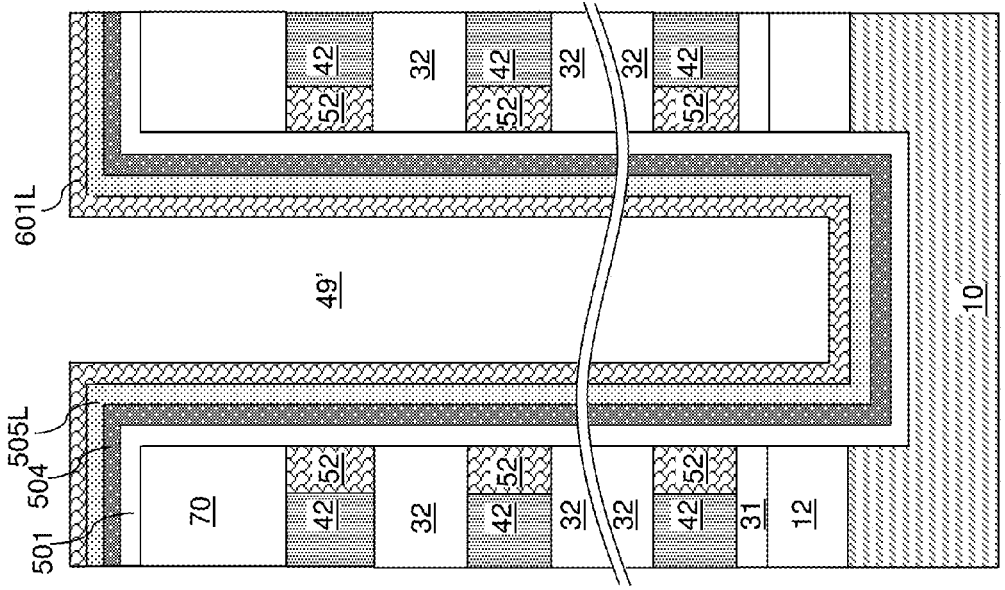

Referring to FIG. 10D, the processing steps of FIGS. 2F, 2G, 2H, 2I, and 2J can be subsequently performed. The anisotropic etch for etching horizontal portions of the first semiconductor channel layer 601L, the tunneling dielectric layer 505L, and the memory material layer 504 is modified to add another step that etches horizontal portions of the blocking dielectric layer 501. Remaining portions of the blocking dielectric layer 501, the memory material layer 504, and the tunneling dielectric layer 505L (which constitute the tunneling dielectric 505) within a same memory opening collectively constitute a memory film 50. Thus, the memory film 50 comprises a blocking dielectric layer 501 contacting inner sidewalls of the annular semiconductor material portions 52.

Subsequently, the processing steps of FIGS. 4, 5A, and 5B are performed.

Referring to FIG. 11A, a magnified region of the exemplary structure incorporating a second exemplary memory stack structure is shown in a magnified view after formation of the backside recesses 43 by removal of the second material layers (i.e., the sacrificial material layers 42) selective to the first material layers (i.e., the insulator layers 32). During removal of the second material layers (i.e., the sacrificial material layers 42), the second material layers are removed employing an etch chemistry that is selective to the semiconductor material of the annular semiconductor material portions 52. For example, if the insulator layers 32 comprise silicon oxide and the sacrificial material layers 42 comprise silicon nitride, a wet etch employing phosphoric acid can be employed to etch the sacrificial material layers 42 selective to the insulator layers 32 and the plurality of annular semiconductor material portions 52. In another example, the insulator layers 32 comprise silicon nitride or silicon oxide, the sacrificial material layers 42 comprise germanium or a germanium-containing alloy, and the plurality of annular semiconductor material portions comprises amorphous silicon or polycrystalline silicon. In this case, a wet etch process employing hydrogen peroxide and optionally ammonium hydroxide can be performed to etch the sacrificial material layers 42 selective to the insulator layers 32 and the plurality of annular semiconductor material portions 52.

Referring to FIG. 11B, the semiconductor material of the annular semiconductor material portions 52 can be removed employing another etch chemistry that is selective to the dielectric material of the outermost layer of the memory film 50 (e.g., to the dielectric material of the blocking dielectric layer 501). For example, if the annular semiconductor material portions 52 comprise silicon and the blocking dielectric layer comprises a dielectric metal oxide or silicon oxide, the annular semiconductor material portions 52 can be removed by an isotropic etch employing an alkaline organic solution, such as TMY. Portions of the outer sidewalls of the blocking dielectric layer 501 are physically exposed to the backside recesses 43.

In an embodiment in which the blocking dielectric layer 501 is omitted, the outermost layer of the memory film 50 can be the memory material layer 504. If the annular semiconductor material portions 52 comprise silicon and the memory material layer 504 comprises silicon nitride, the annular semiconductor material portions 52 can be removed by an isotropic etch employing an alkaline organic solution, such as TMY. Portions of the outer sidewalls of the memory material layer 504 are physically exposed to the backside recesses 43.

Figure 11C:
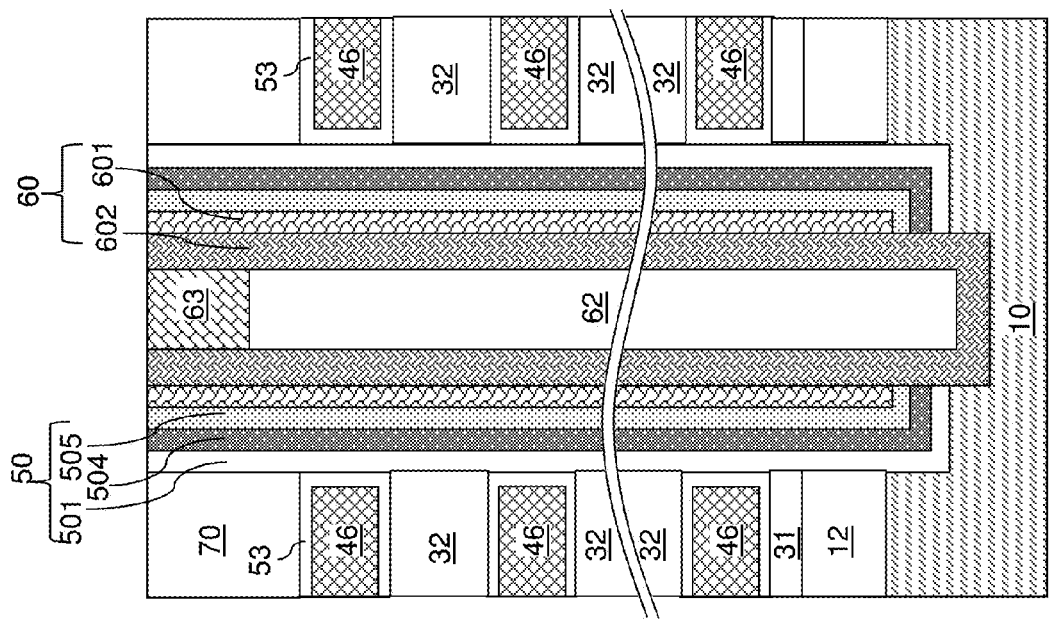
Figure 12:
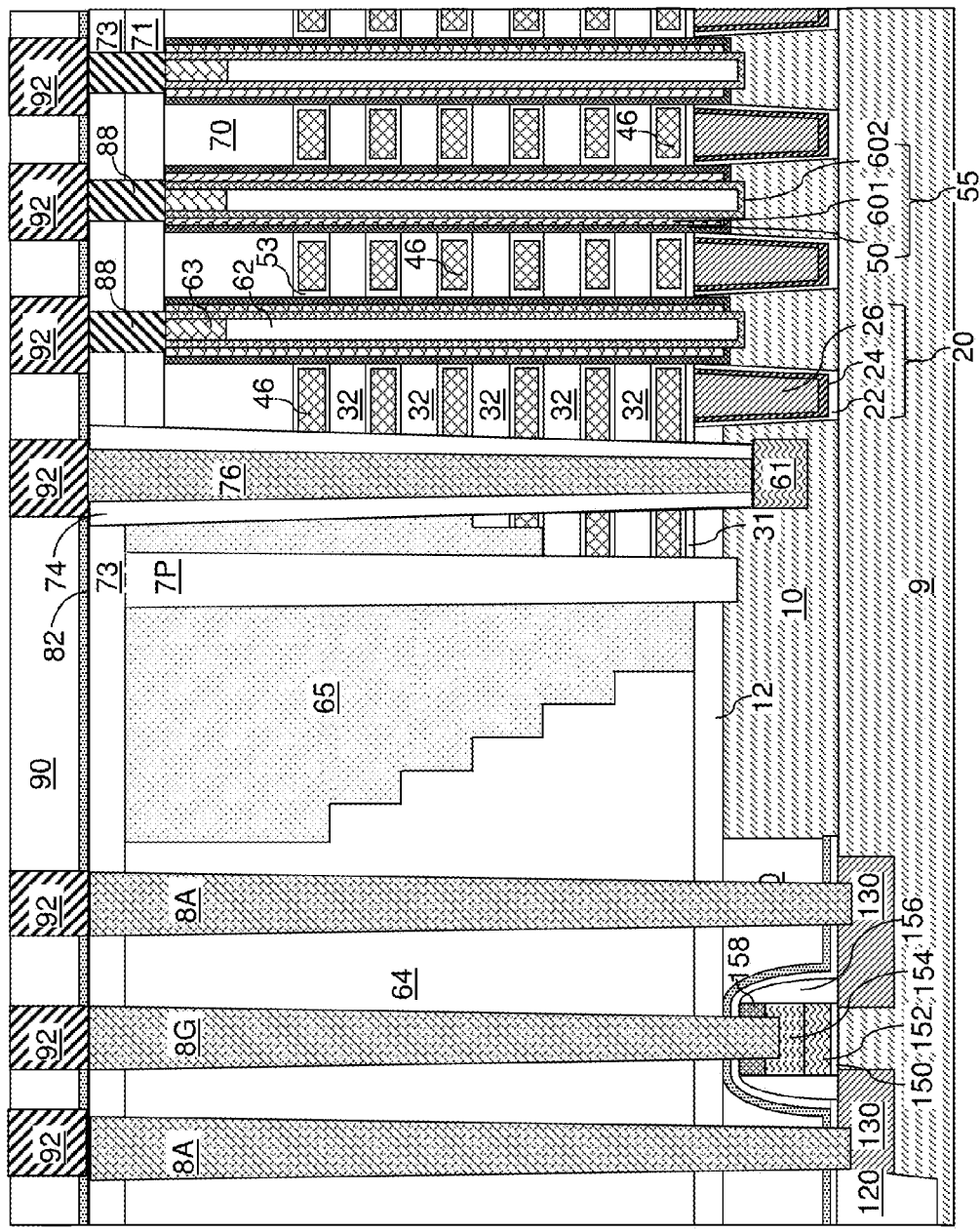
FIG. 12 is a vertical cross-sectional view of the exemplary structure after formation of conductive line structures according to the second embodiment of the present disclosure.

Referring to FIGS. 11C and 7, a backside blocking dielectric layer 53 can be optionally formed in the backside recesses 43. If the blocking dielectric layer 501 is omitted, the backside blocking dielectric layer 50 is formed directly on the outer sidewall of the memory material layer 504. The backside blocking dielectric layer 53 can function as a dielectric material portion which, in combination with the blocking dielectric layer 501 (if present), blocks leakage of stored electrical charges from the memory material layer 504 to control gate electrodes to be subsequently formed.

The electrically conductive layers 46 can then be formed to fill the backside recesses 46 in the same manner as in the first embodiment. Subsequently, the processing steps of FIGS. 8, 9A, and 9B can be performed to provide the exemplary structure illustrated in FIG. 12.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a three-dimensional memory device, comprising:
    forming a stack of alternating layers comprising first material layers and second material layers over a substrate;
    forming a memory opening through the stack;
    laterally recessing sidewall surfaces of the second material layers with respect to sidewall surfaces of the first material layers within the memory opening;
    forming annular semiconductor material portions by depositing a semiconductor material from the sidewall surfaces of the second material layers while the semiconductor material does not grow from surfaces of the first material layers;
    forming a memory film over inner surfaces of the annular semiconductor material portions.

2. The method of claim 1, further comprising:
forming backside recesses by removing the second material layers selective to the first material layers; and
forming electrically conductive layers in the backside recesses.

3. The method of claim 2, further comprising removing at least an outer portion of each of the annular semiconductor material portions after removing the second material layers.

4. The method of claim 1, wherein the second material layers are removed employing an etch chemistry that is selective to the semiconductor material of the annular semiconductor material portions.

5. The method of claim 1, further comprising converting an inner portion of each annular semiconductor portion into an annular dielectric material portion that includes a dielectric material, wherein each remaining annular semiconductor material portion comprises the semiconductor material.

6. The method of claim 5, further comprising:
forming backside recesses by removing the second material layers selective to the first material layers; and
removing the remaining annular semiconductor material portions selective to the annular dielectric material portions.

7. The method of claim 1, wherein forming the memory film comprises forming a blocking dielectric layer on the inner surfaces of the annular semiconductor material portions, and the method further comprises removing the semiconductor material of the annular semiconductor material portions employing another etch chemistry that is selective to a material of the blocking dielectric layer.

8. The method of claim 1, wherein:
the first material layers comprise silicon oxide layers and the second material layers comprise silicon nitride layers; and
the annular semiconductor material portions are formed by a selective deposition process.

9. The method of claim 8, wherein a semiconductor precursor gas and an etchant gas are flowed into a process chamber including a combination of the substrate and the stack concurrently or alternately during the selective deposition process.

10. The method of claim 8, wherein the sidewall surfaces of the second material layers are laterally recessed with respect to the sidewall surfaces of the first material layers employing an isotropic etch chemistry.

11. The method of claim 1, wherein forming the memory film comprises:
forming a blocking dielectric layer over the annular semiconductor material portions;
forming at least one charge storage element on the blocking dielectric layer; and
forming a tunneling dielectric on the at least one charge storage element.

12. The method of claim 1, wherein:
the three-dimensional memory device comprises a vertical NAND device;
portions of the second material layers are replaced with electrically conductive layers; and
at least one of the electrically conductive potions in the stack comprises, or is electrically connected to, a word line of the vertical NAND device.

13. The method of claim 12, wherein:
the vertical NAND device comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in the first device level and a second control gate electrode located in the second device level;
the electrically conductive portions in the stack comprise, or are in electrical contact with, the plurality of control gate electrodes and extend from the device region to a contact region containing the plurality of electrically conductive via connections; and
the substrate comprises a silicon substrate containing a driver circuit for the vertical NAND device.

* * * * *